(12) United States Patent
Hara et al.

(10) Patent No.: US 6,980,263 B2
(45) Date of Patent: Dec. 27, 2005

(54) DISPLAY DEVICE USING BIDIRECTIONAL TWO-TERMINAL ELEMENT AND MANUFACTURING METHOD THEREOF

(75) Inventors: Takeshi Hara, Nara (JP); Toshinori Sugihara, Sendai (JP)

(73) Assignee: Sharp Kabushiki Kaisha, Osaka (JP)

( * ) Notice: Subject to any disclaimer, the term of this patent is extended or adjusted under 35 U.S.C. 154(b) by 199 days.

(21) Appl. No.: 10/445,869

(22) Filed: May 28, 2003

(65) Prior Publication Data
US 2003/0222571 A1 Dec. 4, 2003

(30) Foreign Application Priority Data
Jun. 3, 2002 (JP) .............................. 2002-161100

(51) Int. Cl.[7] .......................... G02F 1/135; G02F 1/136
(52) U.S. Cl. .......................................... 349/49; 349/51
(58) Field of Search ......................... 313/500; 349/49, 349/51; 315/169.3

(56) References Cited

U.S. PATENT DOCUMENTS

| | | | |
|---|---|---|---|
| 4,126,854 A | 11/1978 | Sheridon | |
| 5,528,399 A | 6/1996 | Izumi et al. | |
| 5,715,026 A * | 2/1998 | Shannon | 349/49 |
| 5,719,647 A * | 2/1998 | Fujikawa et al. | 349/40 |
| 6,259,501 B1 * | 7/2001 | Yaniv | 349/122 |
| 6,291,896 B1 | 9/2001 | Smith | |
| 6,340,812 B1 * | 1/2002 | Izumi et al. | 250/208.1 |
| 6,411,272 B1 * | 6/2002 | Edwards | 345/87 |
| 6,535,264 B1 * | 3/2003 | Imabayashi et al. | 349/155 |
| 6,664,569 B2 * | 12/2003 | Moon | 257/72 |
| 6,822,264 B2 * | 11/2004 | Yamazaki et al. | 257/79 |
| 6,849,128 B2 * | 2/2005 | Yonekura et al. | 118/621 |
| 6,861,121 B2 * | 3/2005 | Matsunaga et al. | 428/141 |

FOREIGN PATENT DOCUMENTS

| | | |
|---|---|---|
| JP | 64-086116 | 3/1989 |
| JP | 11-243209 | 9/1999 |
| JP | 2001-305515 | 10/2001 |
| WO | WO 03/049068 A1 | 6/2003 |

OTHER PUBLICATIONS

N. Koshida et al. : "Visible Electroluminescence from Porous Silicon"; Applied Physics Letters vol. 60 (3); Jan. 20, 1992; pp. 347-349.

L. T. Canham: "Silicon Quantum Wire Array Fabrication by Electrochemical and Chemical Dissolution of Wafers"; Appl. Phys. Lett. vol. 57 (10); Sep. 3, 1990, pp. 1046-1048 (Abstract Only).

K. Shigehiro et al.: "Toner Display Using Insulative Particles Charged Trielectrically"; Japan Hardcopy 2001; pp. 135-138.

* cited by examiner

*Primary Examiner*—Wilson Lee
*Assistant Examiner*—Angela M Lie
(74) *Attorney, Agent, or Firm*—Keating & Bennett, LLP

(57) ABSTRACT

A display device includes a plurality of first electrodes, a plurality of picture electrodes electrically connected to one of the plurality of first electrodes via at least one bidirectional two-terminal element respectively, a plurality of second electrodes, and a display medium layer provided between the plurality of picture electrodes and plurality of second electrodes. The first electrodes have an electrode layer having an opening formed at least in a portion of an area overlapping the plurality of picture electrodes so as to prevent degradation of display quality caused by a parasitic capacitance.

18 Claims, 17 Drawing Sheets

FIG.3A
(a)
(b)
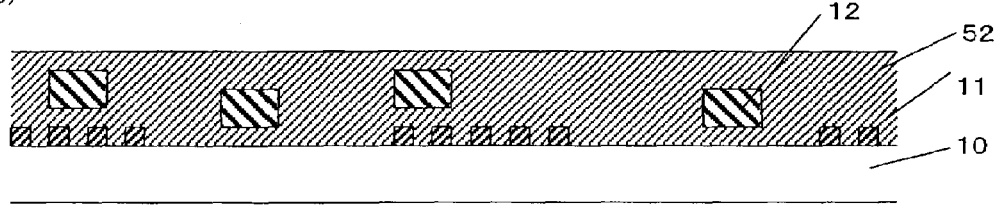
(c)
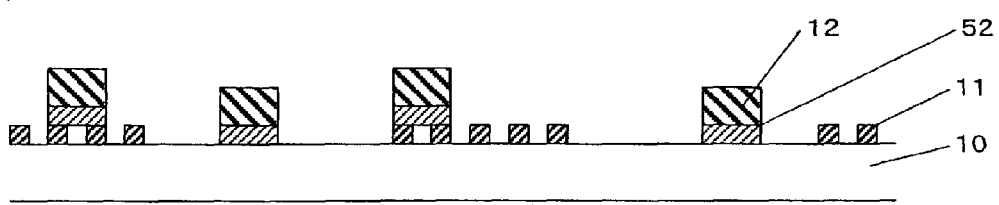
(d)
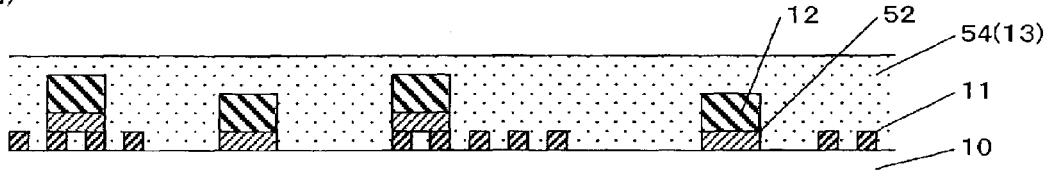
(e)
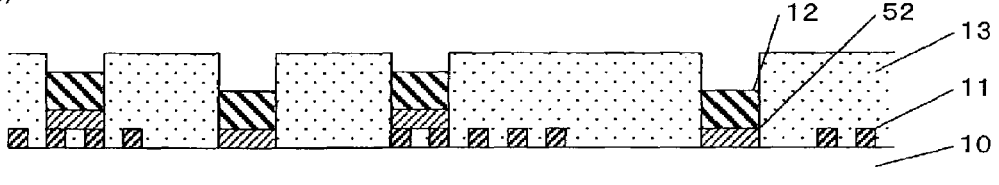
(f)
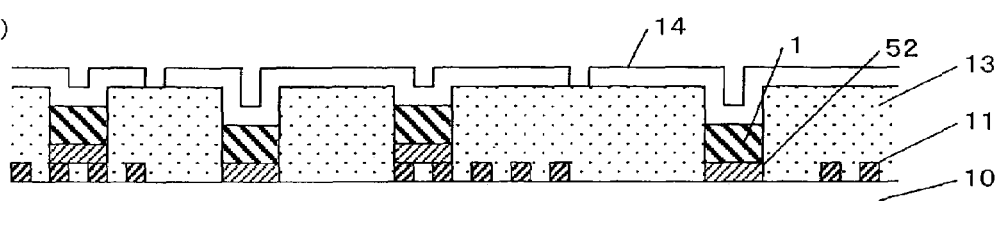

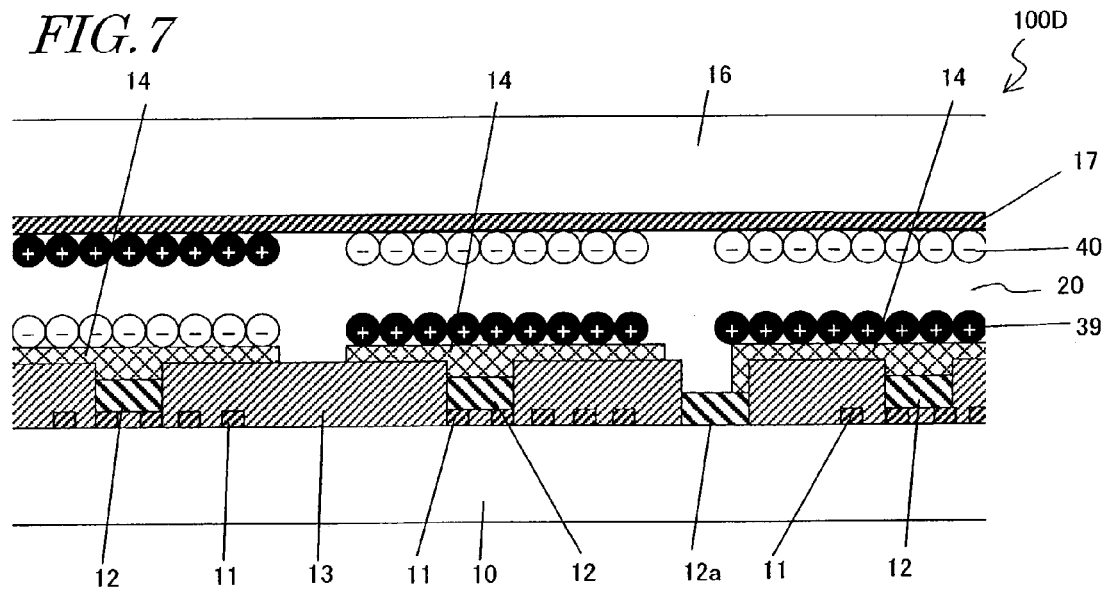
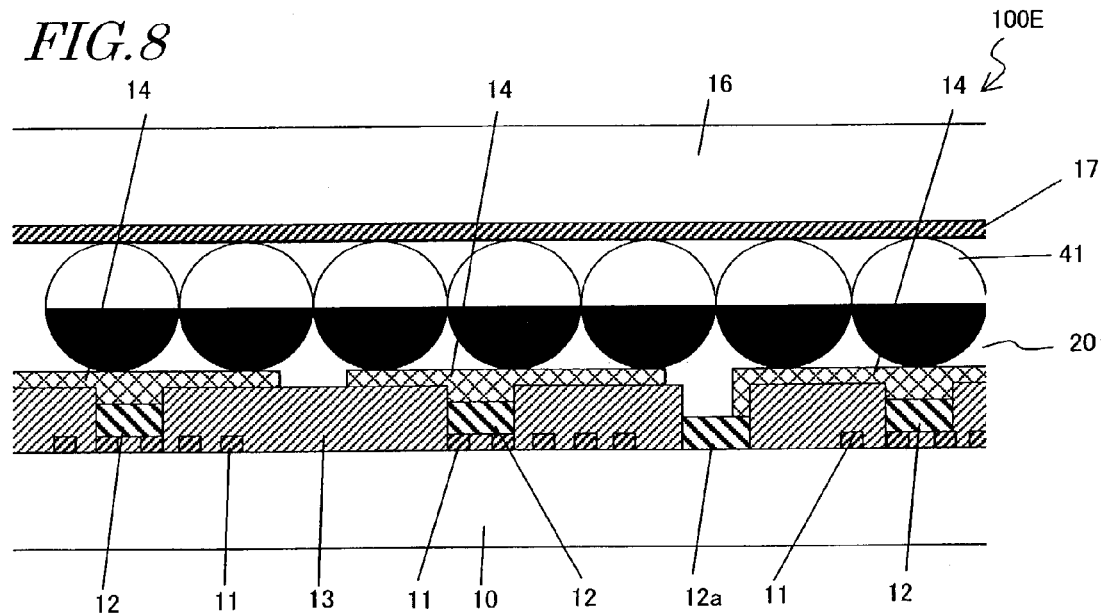

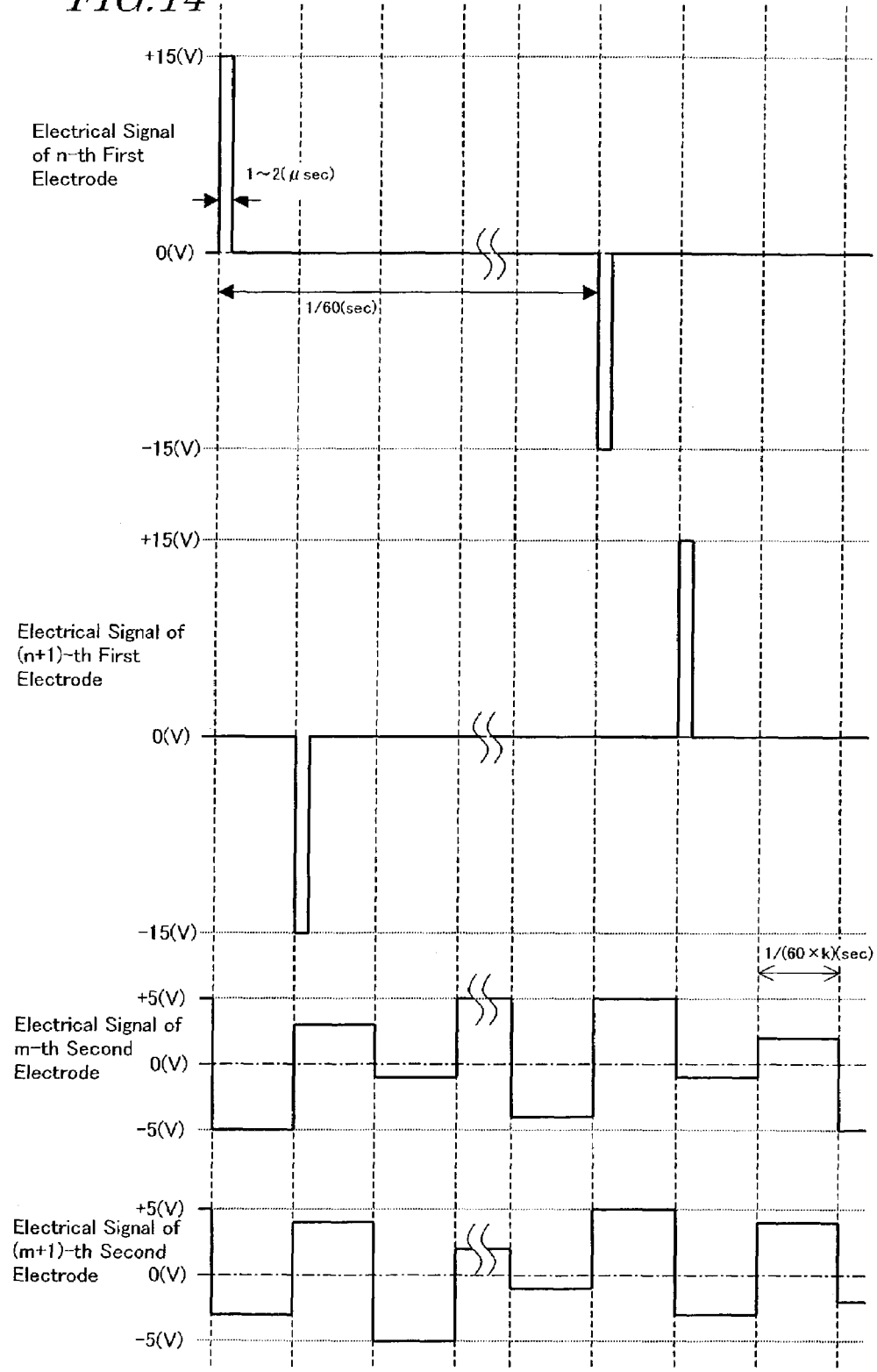

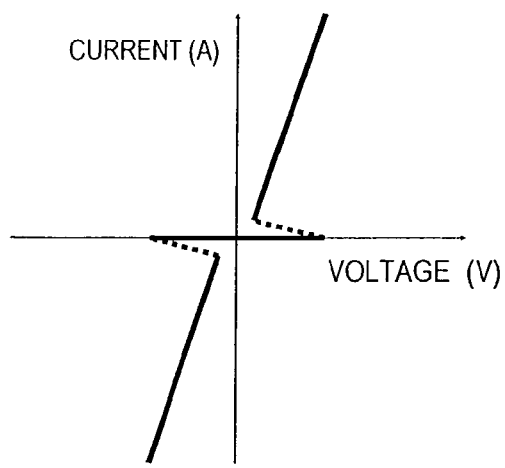 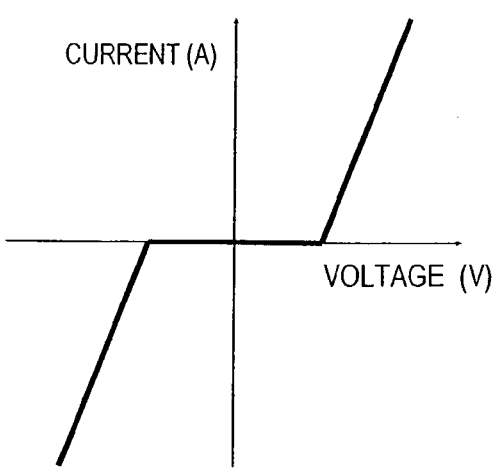
*FIG.20A*  *FIG.20B*

DISPLAY DEVICE USING BIDIRECTIONAL TWO-TERMINAL ELEMENT AND MANUFACTURING METHOD THEREOF

BACKGROUND OF THE INVENTION

1. Field of the Invention

The present invention relates to a display device and an active matrix substrate used therein, and in particular, to a switching element used for the display device and an active matrix substrate used therein, and methods for producing the display device and the active matrix substrate.

2. Description of the Related Art

In recent years, significant progress has been made in the use of low-profile display (FPD) devices such as a liquid crystal display and an organic EL (electro luminescence) display device. Of the low-profile display devices, an active matrix type display device capable of high-quality display in particular has three-terminal elements such as an amorphous silicon TFT (thin-film transistor), a polysilicon TFT and two-terminal elements such as an MIM (Metal-Insulator-Metal) used as switching elements thereon.

These switching elements are formed on a substrate constituting a display device in a process of manufacturing the display device. The switching elements are generally formed by repeating a film deposition process and a patterning process a plurality of times. For instance, in the case of a TFT, it is necessary to repeat the film deposition process and a patterning process at least three times, and these processes are usually repeated four to eight times. In the case of the MIM, it is necessary to repeat the film deposition process and a patterning process at least twice, and these processes are usually repeated three to four times.

The switching element is formed according to the specific characteristics of a pixel. Because the area of the switching element is smaller than the area of the pixel, various thin films (a metallic layer, an insulating layer and a semiconductor layer for instance) which are deposited on almost the entire surface of the substrate are mostly eliminated in the patterning process. For instance, in the case of a transmissive liquid crystal display, approximately 90 percent of the metallic layer and semiconductor layer is eliminated in order to increase a pixel open area ratio.

The patterning process is mostly performed by a photolithographic process using photomasks, where it is necessary to align the photomasks with high precision in each process in order to suppress variations in element characteristics.

Furthermore, the substrates are becoming larger in size due to increasing size of display devices or for the sake of improving manufacturing efficiency, and so an apparatus for performing the film deposition process and patterning process is becoming larger in size.

As described above, the active matrix type FPD in the past has most of the materials for forming the switching element removed so that, as resources and energy are lost, costs thereof increase and a load to the environment also increases.

In addition, for the purposes of coping with the larger-size substrates, an expensive film deposition apparatus and a photolithographic apparatus for forming the switching element become larger in size. For that reason, manufacturing costs increase, and it becomes difficult to form the switching element having little variations in element characteristics over a large area.

As a method of solving these problems, the applicant of the present application proposed in Japanese Patent Application No. 2001-374559 an active matrix type display device which can be manufactured by an easier method than before by using a bidirectional two-terminal element produced in a process independent from a manufacturing process of the display device and a manufacturing method thereof. It should be noted that Japanese Patent Application No. 2001-374559 was not published prior to the filing date of the Japanese Priority Application for the present patent application.

In addition, U.S. Pat. No. 5,715,026 is relevant to the present invention and discloses a method for producing an active matrix type display device by using an individual non-linear active element produced beforehand.

In the configuration shown in FIG. 21, and similarly in the configuration disclosed in U.S. Pat. No. 5,715,026, a display device 900 disclosed in the above-identified Japanese patent application has a first electrode 91 and a picture electrode 14 electrically connected to the first electrode 91 via at least one bidirectional two-terminal element 12. A predetermined voltage is applied to a display medium layer (not shown) by a second electrode (not shown) arranged to be opposed to the picture electrode 14 via the display medium layer so as to perform display.

In the configuration shown in FIG. 21, however, there are cases in which the area of the region in which the first electrode 91 and the picture electrode 14 are overlapping is so large that a parasitic capacitance between the first electrode 91 and picture electrode 14 becomes significant so as to degrade display quality due to shadowing and other disadvantageous effects.

SUMMARY OF THE INVENTION

In order to solve the problems described above, preferred embodiments of the present provide an active matrix type display device which can be manufactured by an easier method than before and has high-quality display, and also provide a method of manufacturing such a novel active matrix type display device.

A display device according to a preferred embodiment of the present invention includes a plurality of first electrodes, a plurality of picture electrodes electrically connected to one of the plurality of first electrodes via at least one bidirectional two-terminal element respectively, a plurality of second electrodes, and a display medium layer provided between the plurality of picture electrodes and the plurality of second electrodes, wherein each of the plurality of first electrodes has an electrode layer having an opening formed at least in a portion of an area overlapping the plurality of picture electrodes.

Preferably, the electrode layer has a transparent conductive layer having the opening formed therein and a metallic layer formed on a side of the transparent conductive layer.

It is also preferably that a layout relationship between each of the plurality of picture electrodes and the at least one bidirectional two-terminal element is random.

The at least one bidirectional two-terminal element preferably includes a thyristor having a pair of electrodes and a semiconductor element disposed between the pair of electrodes. Each of the plurality of bidirectional two-terminal elements may further have a light shielding layer covering a side of the semiconductor element.

According to another preferred embodiment, the at least one bidirectional two-terminal element is an MIM element having a pair of electrodes and an insulating layer disposed between the pair of electrodes.

It is desirable that each of the plurality of first electrodes and the at least one bidirectional two-terminal element are electrically connected via a conductive resin layer provided between one of the pair of electrodes of the at least one bidirectional two-terminal element and the first electrode.

The conductive resin layer may also include a conductive material and a photosensitive resin.

Preferably, the opening has a width that is narrower than the width of the plurality of bidirectional two-terminal elements.

According to another preferred embodiment, the area of a region in which the electrode layer and the plurality of first electrodes are overlapping is about half or less of the area of the plurality of picture electrodes.

Preferably, the width of the plurality of bidirectional two-terminal elements is smaller than a distance between adjacent ones of the plurality of picture electrodes.

The width of the plurality of bidirectional two-terminal elements is preferably smaller than a distance between adjacent ones of the plurality of first electrodes.

A method of manufacturing a display device according to a preferred embodiment of the present invention includes the steps of (a) forming on a principal surface of a substrate a plurality of first electrodes having an electrode layer with an opening formed therein, (b) preparing a plurality of bidirectional two-terminal elements, each having a pair of mutually opposed electrodes, (c) arranging the plurality of bidirectional two-terminal elements on the plurality of first electrodes so that each of the plurality of bidirectional two-terminal elements is electrically connected to one of the plurality of first electrodes via one of the pair of mutually opposed electrodes, (d) forming a plurality of picture electrodes so as to be electrically connected to one of the plurality of first electrodes via at least one of the plurality of bidirectional two-terminal elements respectively, and (e) forming a plurality of second electrodes and a display medium layer so as to be mutually opposed between the plurality of picture electrodes and the plurality of second electrodes via the display medium layer.

According to a preferred embodiment, the step (a) includes the steps of (a-1) forming on the principal surface of the substrate a transparent conductive layer having an opening, and (a-2) forming the metallic layer on a side of the transparent conductive layer by using a plating method.

According to another preferred embodiment, the step (c) includes the steps of (c-1) dispersing the plurality of bidirectional two-terminal elements in a predetermined density in a coating material including a conductive material and a resin material; (c-2) providing the coating material including the plurality of bidirectional two-terminal elements on the plurality of first electrodes of the substrate; and (c-3) selectively leaving the coating material existing between the plurality of first electrodes of the substrate and the plurality of bidirectional two-terminal elements.

The resin material may include a positive-type photosensitive resin, and the step of selectively leaving the coating material may include a step of irradiating light from the principal surface side of the substrate.

According to yet another preferred embodiment, the step (d) includes the steps of: (d-1) providing an insulating material to cover the plurality of bidirectional two-terminal elements placed on the plurality of first electrodes; (d-2) selectively eliminating the insulating material on the plurality of bidirectional two-terminal elements and thereby exposing the other electrode of each of the plurality of bidirectional two-terminal elements; and (d-3) forming the plurality of picture electrodes, each of them electrically connected to the other electrode which is exposed.

The insulating material may include a negative-type photosensitive resin, and the step of exposing the other electrode may include a step of irradiating light from a backside of the substrate.

Other features, elements, characteristics, features, steps, processes and advantages of the present invention will become more apparent from the following detailed description of preferred embodiments thereof with reference to the attached drawings.

BRIEF DESCRIPTION OF THE DRAWINGS

FIGS. 3A(*a*) to 3A(*f*) are schematic sectional views for explaining a manufacturing method of the display device 100 according to a preferred embodiment of the present invention.

FIG. 7 is a schematic sectional view of a toner display device 100D according to a preferred embodiment of the present invention.

FIG. 8 is a schematic sectional view of a twist-ball-method display device 100E according to a preferred embodiment of the present invention.

FIG. 14 is a diagram showing a waveform and timing of the electrical signal for explaining a driving method of the liquid crystal display 100A.

FIG. 20A is a graph schematically showing a voltage-electric current characteristic of a thyristor.

FIG. 20B is a graph schematically showing a voltage-electric current characteristic of an MIM element.

DETAILED DESCRIPTION OF PREFERRED EMBODIMENTS

Display Device

First, a display device according to a preferred embodiment of the present invention and a manufacturing method thereof will be described.

Figure 1:
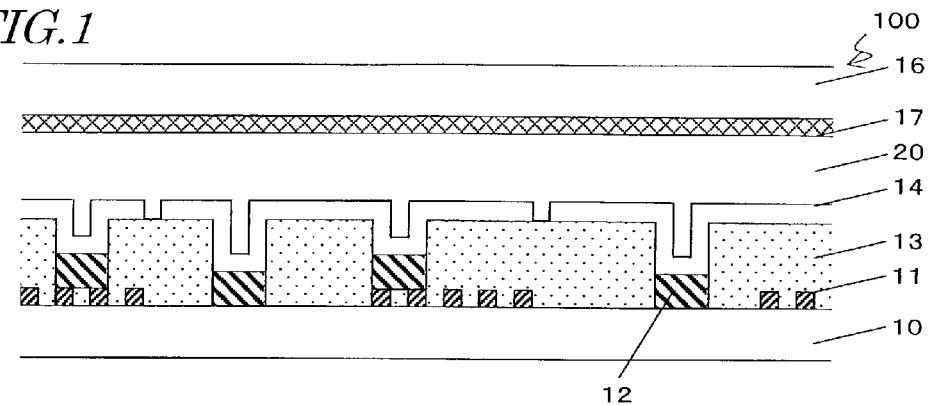
FIG. 1 is a schematic sectional view of a display device 100 according to a preferred embodiment of the present invention.
Figure 2:
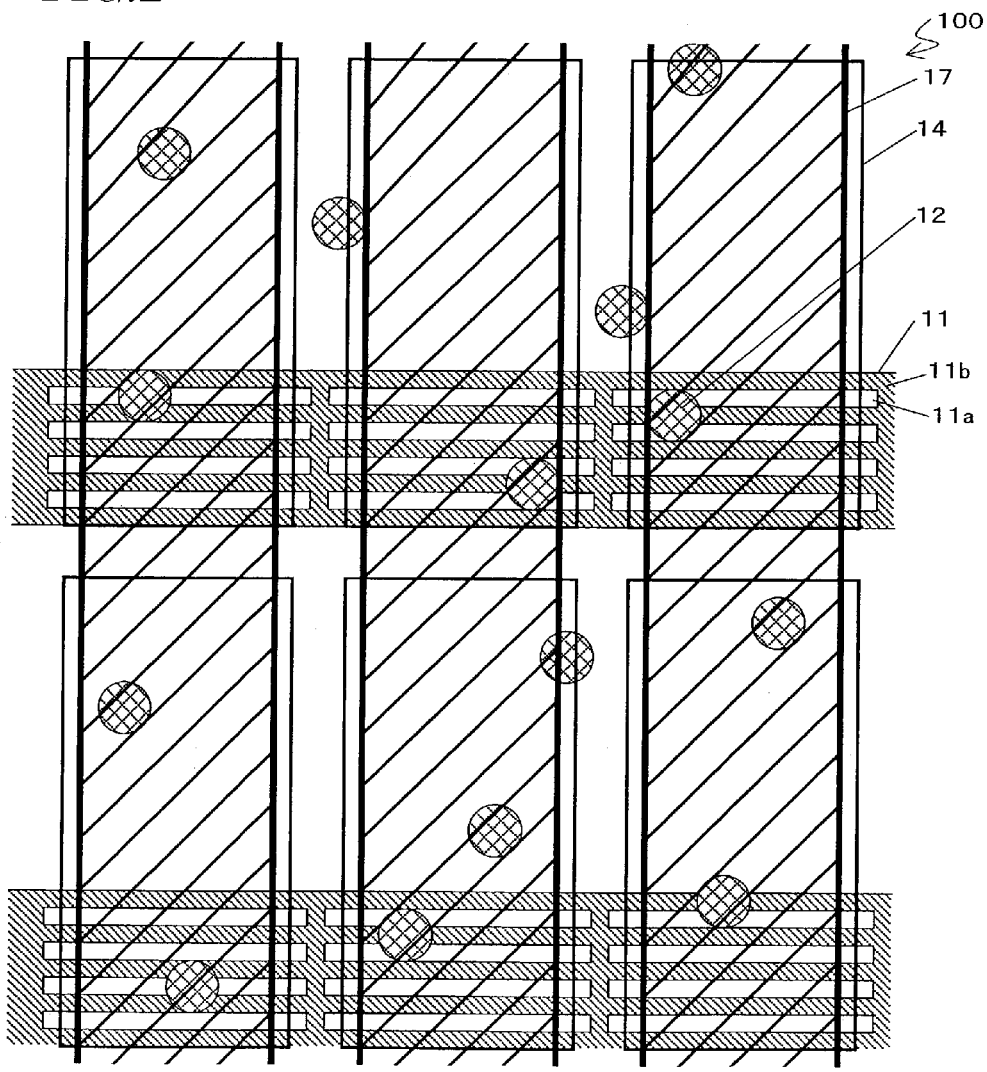
FIG. 2 is a schematic plan view of the display device 100 according to a preferred embodiment of the present invention.

FIG. 1 shows a schematic sectional view of a display device 100 according to a preferred embodiment of the present invention, and FIG. 2 shows a plan view thereof.

The display device 100 preferably includes a first substrate 10 having a plurality of first electrodes 11 and a plurality of picture electrodes 14 electrically connected to any one of the plurality of first electrodes via at least one bidirectional two-terminal element 12 respectively disposed on its principal surface, a second substrate 16 having a plurality of second electrodes 17 disposed on its principal surface, and a display medium layer 20 provided between the picture electrodes 14 and second electrodes 17. The first electrodes 11 and second electrodes 17 are preferably stripe-like electrodes extended in a substantially mutually perpendicular direction, and a portion in which the picture electrode 14 and second electrode 17 are overlapping defines each individual pixel.

In the example shown in FIG. 2, a layout relationship between the picture electrodes 14 and bidirectional two-terminal elements 12 is preferably random. There are cases where a plurality of the bidirectional two-terminal elements 12 exists between one picture electrode 14 and one first electrode 11. There may also be provided a bidirectional two-terminal element 12 which does not contribute to an electrical connection between the picture electrode 14 and first electrode 11. It is possible, by randomly placing the bidirectional two-terminal elements 12, to use the manufacturing method described later so that an advantage of thereby simplifying the manufacturing process is significant.

The first electrode 11 of the display device 100 has an electrode layer 11b having an opening 11a formed at least in a portion of a region in which it is overlapping the picture electrode 14. Therefore, the area of the region in which the first electrode 11 and picture electrode 14 are overlapping preferably is actually smaller than the area of the region in which the electrode layer 11b and picture electrode 14 are overlapping so as to prevent degradation of display quality due to shadowing and other disadvantageous effects caused by a parasitic capacitance between the picture electrode 14 and first electrode 11.

Here, the first electrode 11 includes the opening 11a and electrode layer 11b, where "the area of the first electrode 11" indicates the area of the region including the opening 11a, and "the area of the electrode layer 11b" does not include the area of the opening 11a.

As described later, in the case where the bidirectional two-terminal elements 12 are randomly placed on the surface of the first substrate 10, the area of the first electrode 11 needs to be at least larger than the area of the surface on which the electrodes of the bidirectional two-terminal elements 12 are formed (hereafter, referred to as the "size" of the bidirectional two-terminal elements 12), and desirably as large as possible, in order to securely make electrical connections between the first electrodes 11 and the bidirectional two-terminal elements 12. In order to simplify the manufacturing process, it is desirable to provide a space between mutually adjacent picture electrodes 14 that is larger than a maximum width of the bidirectional two-terminal elements 12, and also to provide a space between mutually adjacent first electrodes 11 that is larger than a maximum width of the bidirectional two-terminal elements 12.

Figure 21:
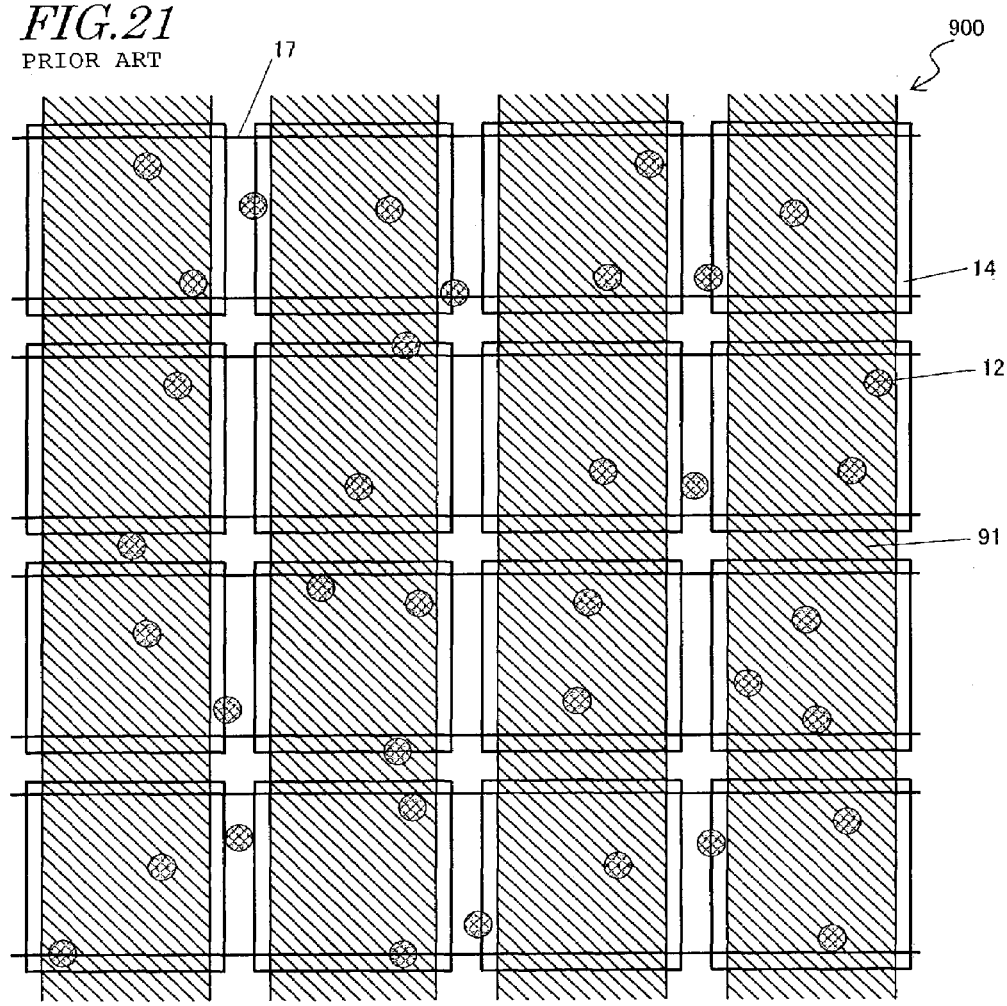
FIG. 21 is a plan view for schematically showing structure of a display device 900 disclosed in Japanese Patent Application No. 2001-374559

From such a viewpoint, a display device 900 shown in FIG. 21 has the width of a first electrode 91 set to be approximately equal to that of the picture electrode 14. However, the first electrode 91 has no opening (that is, the area of the first electrode 91 equals the area of the electrode layer) so that the parasitic capacitance between it and the picture electrode 14 becomes large so as to degrade the display quality. As opposed to this, as shown in FIG. 2, the first electrode 11 of the display device 100 has the opening 11a. Thus, it is the electrode layer 11b that actually forms the parasitic capacitance with the picture electrode 14, so that it can be rendered smaller than the area of the first electrodes 11. In FIG. 2, the width of the first electrode 11 is rendered small in order to reduce the area overlapping the picture electrode 14. However, it is also possible to reduce the area of the electrode layer 11b by the portion of the opening 11a by making the width approximately equal to that of the picture electrode 14 as with the first electrode 91 shown in FIG. 21.

In addition, if the shape and size of the opening 11a is set so that the bidirectional two-terminal elements 12 are electrically connected to the electrode layer 11b wherever they are placed on the first electrodes 11, the effective area of the first electrodes 11 that is usable for the electrical connection to the bidirectional two-terminal elements 12 will not be reduced by the opening 11a.

Furthermore, the opening 11a may be formed in the region in which the first electrode 11 and the picture electrode 14 are overlapping, and so it is not necessary, as shown in FIG. 2, to provide the opening 11a in the portion of the first electrode 11 in a position opposed to the spacing between the picture electrodes 14. To improve conductivity (to reduce electric resistance) of the first electrodes 11, it is rather desirable not to provide the opening 11a. In consideration of these points, the first electrode 11 of the display device 100 preferably has a stripe-like opening 11a having a width that is smaller than the size of the bidirectional two-terminal element 12 provided in the region in which it is overlapping the picture electrode 14. As a matter of course, the shape of the opening 11a is not limited to the above-described stripe-shaped and may be other suitable shapes.

The bidirectional two-terminal element 12 is preferably a thyristor having a pair of electrodes 26, 27 and a laminated semiconductor element 12A disposed between the pair of electrodes 26, 27, for instance, as described later by referring to FIGS. 12A and B and FIGS. 13A to E. From a viewpoint of operational stability of the bidirectional two-terminal element 12, it is desirable to have the sides of the laminated semiconductor element 12A covered by a light shielding layer 28 except for the case of addressing by using the light. It is also possible to use an MIM element 12" shown in FIG. 12C.

The display device 100 preferably has the bidirectional two-terminal element (a bidirectional thyristor, for instance) 12 turned on and off according to a voltage applied to the first electrodes 11, and a predetermined voltage is thereby applied (or current is supplied) to the display medium layer 20 between the picture electrodes 14 and second electrodes 17 so as to perform display. As for the display medium layer 20, various types of display medium layers such as a liquid crystal layer and an organic EL layer may be used. A specific configuration of the display device according to the types of display medium will be described later.

Next, the manufacturing method of the display device 100 will be described by referring to FIGS. 3A(a) to 3(f) and FIG. 3B. Here, the bidirectional two-terminal elements 12 (12', 12") shown in FIGS. 12A, B or C are preferably used. The configuration and manufacturing method of the bidirectional two-terminal elements 12 will be described later.

First, as shown in FIG. 3A(a), the first electrodes 11 are formed on the surface of the first substrate 10 having an insulating surface. In this case, the electrode layer 11b having the opening 11a is formed at least in a portion of the region in which the first electrodes 11 are overlapping the picture electrodes 14. The shape and size of the first electrode 11 and the shape, size and placement of the opening 11a are set as appropriate. A material for forming the electrode layer 11b may be a transparent conductive material (ITO, for instance) or may also be an opaque conductive material such as a metallic material (Al. Mo or Ta, for instance). In the case of constituting a transmissive display device, however, it is desirable to use the transparent conductive material from a viewpoint of usability of the light. The electrode layer 11b is formed by using public film deposition process and patterning process (photolithographic process, for instance).

Figure 3B:
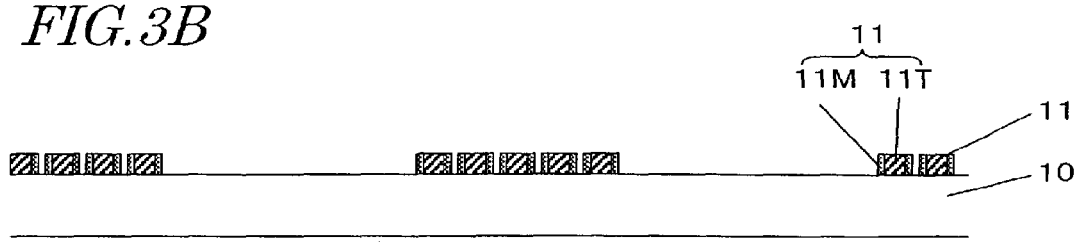
FIG. 3B is a schematic sectional view for explaining another manufacturing method of a first electrode 11 in the manufacturing method of the display device 100 according to a preferred embodiment of the present invention.

Here, in the case of constituting the first electrodes 11 by using the transparent conductive material, it is also possible, as shown in FIG. 3B, to form a metallic layer (low resistance layer) 11M made of a metal such as Cu, Ni or Au on the sides of a transparent conductive layer 11T by a plating method. If the opening 11a is formed on the first electrode 11, the conductivity of the first electrode 11 is reduced, and the display quality may be degraded in the case of a high-resolution display device, for instance. It is possible, by forming the metallic layer 11M, to enhance the conductivity (reduce the resistance) of the first electrode 11. In particular, in the case where the first electrode 11 has a large number of the openings 11a thereon, the surface area on which the metallic layer 11M is formed by the plating method becomes larger so as to further reduce the resistance. Therefore, it is desirable to optimize the size and shape of the opening 11a in consideration of the conductivity.

Next, as shown in FIG. 3A(b), the bidirectional two-terminal elements 12 are randomly placed on the principal surface of the first substrate 10. In this case, as shown in FIG. 2, the bidirectional two-terminal elements 12 are placed so that each individual picture electrode 14 is electrically connected to a corresponding first electrode 11 by at least one bidirectional two-terminal element 12. The bidirectional two-terminal elements 12 are randomly placed on the principal surface of the first substrate 10 with an area density (number of the elements 12 per unit area) such that three bidirectional two-terminal elements 12 are placed against one picture electrode 14 on average.

The bidirectional two-terminal elements 12 are preferably placed so that one of the electrodes of the bidirectional two-terminal element 12 (electrode 26 or 27 in FIG. 12) is electrically connected to the first electrode 11. To place the bidirectional two-terminal elements 12 stably on the principal surface of the first substrate 10, it is desirable to use substantially cylindrical bidirectional two-terminal elements 12. If the substantially cylindrical bidirectional two-terminal elements 12 having the electrodes formed on the bottom and top surfaces are used, they are stably placed on the principal surface only on the bottom and top surfaces so that the electrical connections are reliably achieved.

A description will be given of a specific process of randomly placing the bidirectional two-terminal elements 12 on the principal surface of the first substrate 10 having the first electrode 11 formed thereon, for instance, by referring to FIGS. 3A(b) and 3A(c).

First, the bidirectional two-terminal elements 12 are dispersed in a predetermined density in a coating material including a conductive material and a resin material. For instance, the coating material wherein powdered ITO is dispersed in the resin material preferably having photosensitivity is prepared. It is possible to further mix a solvent in order to adjust viscosity and film thickness. As for the coating material, it is sufficient to show the conductivity capable of electrically connecting the bidirectional two-terminal element 12 to the first electrode 11 in a definitive state. A coating material 52 including the bidirectional two-terminal elements 12 is provided on the principal surface of the first substrate 10 (FIG. 3A(b)). As for the method of providing the coating material, public coating methods and printing methods may be widely applied.

Next, the coating material existing between the bidirectional two-terminal elements 12 and the principal surface of the first substrate 10 is selectively left. As shown in FIG. 3A(c), the bidirectional two-terminal elements 12 are fixed on the principal surface of the first substrate 10 by performing this step.

For instance, in the case where the resin material included in the coating material 52 is a positive-type photosensitive resin, if the light for decomposing the photosensitive resin is irradiated from the upside in a state shown FIG. 3A(b), the photosensitive resin in the lower portion of the bidirectional two-terminal elements 12 is not irradiated and so it is not decomposed. As shown in FIG. 3A(c), only the photosensitive resin in the lower portion of the bidirectional two-terminal elements 12 is left by undergoing a subsequent development step so that the bidirectional two-terminal elements 12 are thereby fixed.

In the case where the first substrate 10 passes the light, it is also possible, by using a photomask for light-shielding at least a portion of the first electrodes 11 and irradiating the light from the backside of the first substrate 10 after the light irradiation step, to decompose the photosensitive resin in the lower portion of the bidirectional two-terminal elements 12 existing in the spacing of the first electrodes 11 or astride the adjacent first electrodes 11 so as to eliminate unnecessary bidirectional two-terminal elements 12.

Thereafter, as shown in FIG. 3A(d), an insulating material 54 is arranged to cover the bidirectional two-terminal elements 12 placed on the first electrodes 11. An interlayer insulation film (reference numeral 13 in FIG. 1) formed by the insulating material 54 is preferably thicker than the height of the bidirectional two-terminal elements 12. To provide the insulating material 54, public coating methods and printing methods may be widely applied. The insulating material 54 should preferably include the photosensitive resin.

Subsequently, as shown in FIG. 3A(e), the insulating material 54 on the bidirectional two-terminal elements 12 is selectively eliminated so as to expose the other electrodes of the bidirectional two-terminal elements 12. In the case of using a negative-type photosensitive resin as the insulating material 54, if the light is irradiated from the underside surface (the surface opposed to the principal surface), the photosensitive resin positioned on the bidirectional two-terminal elements 12 is not irradiated. However, the photosensitive resin in the other regions has the light passed through or diffracted by the opening 11a of the first electrode 11 irradiated thereto, and so the photosensitive resin in the upper portion of the bidirectional two-terminal elements 12 is selectively eliminated by undergoing the subsequent development step so as to expose the electrodes in the upper portion of the bidirectional two-terminal elements 12. To be more specific, an insulating layer 13 of the display device 100 shown in FIG. 1 is formed.

It is also possible to use the positive-type photosensitive resin as the insulating material 54. In this case, the process undergoes the following steps.

First, the device is coated with the positive-type photosensitive resin, and the positive-type photosensitive resin is exposed from the principal surface side of the first substrate 10. As the electrodes (typically, metal electrodes) are formed on the top surfaces of the bidirectional two-terminal elements 12, light exposure of the positive-type photosensitive resin on the bidirectional two-terminal elements 12 is increased by reflected light from the electrodes, so that there arises a difference in the light exposure between it and the portions other than the bidirectional two-terminal elements 12. It is possible, by utilizing this difference in the light exposure, to selectively eliminate the positive-type photosensitive resin on the bidirectional two-terminal elements 12.

In the case of using a material having no photosensitivity for the insulating material 54, it is possible to form a photosensitive resin layer having openings on the bidirectional two-terminal elements 12 by, after providing the insulating material 54 on the principal surface side of the first substrate 10, coating it with the negative-type or positive-type photosensitive resin and performing the exposure and development by the same method as described above. It is possible, by etching the insulating material 54 by using this photosensitive resin layer having the openings defining an etching mask, to form the interlayer insulating layer 13 of the same structure as described above.

In the step of selectively eliminating the insulating material 54 on the bidirectional two-terminal elements 12 in the process of forming the interlayer insulating layer 13, it is desirable to simultaneously eliminate the insulating material 54 on terminal portions (not shown) of the first electrodes 11. The terminal portions of the first electrodes 11 are provided outside a display area, and are connected to a circuit for supplying a data signal, for instance, to the first electrodes 11.

In the case of using the negative-type photosensitive resin as the insulating material 54 or in the case of combinedly using the insulating material 54 having no photosensitivity and the negative-type photosensitive resin, masks for light-shielding the terminal portions of the first electrodes 11 when exposing the negative-type photosensitive resin from the underside surface of the first substrate 10 should be placed in order to expose the terminal portions of the first electrodes 11. In the case of using the positive-type photosensitive resin as the insulating material 54 or in the case of combinedly using the insulating material 54 having no photosensitivity and the positive-type photosensitive resin, the masks for exposing only the terminal portions of the first electrodes 11 should be used. In any of these cases, precision in mask alignment is very loose so that the precision of approximately 0.1 mm or so is sufficient.

In the case of using the negative-type photosensitive resin, the first substrate 10 and first electrodes 11 should preferably be translucent. In the case of using the positive-type photosensitive resin, however, these components do not need to be translucent.

Thereafter, as shown in FIG. 3A(f), the conductive material (ITO, for instance) is deposited and patterned to cover almost the entire surface of the first substrate 10 so as to form a plurality of the picture electrodes 14 electrically connected to the other exposed electrodes respectively. This step may be performed by public film deposition processes and patterning processes (photolithographic process, for instance). In the case where the picture electrodes 14 are reflectors, a metallic material of high reflectance such as Al or Ag may also be used. In this way, an active matrix substrate having the bidirectional two-terminal elements is obtained.

Next, for instance, the second substrate 16 having the second electrodes 17 formed thereon is prepared, and the first substrate 10 and second substrate 16 are stuck together so that the first electrodes 11 and second electrodes will be mutually opposed and substantially perpendicular via the display medium layer 20 between the picture electrodes 14 and the second electrodes 17. The display medium layer 20 may be formed either before or after the first substrate 10 and second substrate 16 are stuck together. In addition, a spacer (not shown) may also be used, as necessary, in order to define the thickness of the display medium layer 20. In the case of using a liquid crystal layer as the display medium layer 20, an orientation film is preferably formed and a rubbing process is performed as necessary on the surfaces of the first substrate 10 and second substrate 16. Thus, the display device 100 shown in FIG. 2 is obtained. Moreover, as for the display device 100 in FIG. 2, the conductive coating material 52 existing in the lower portion of the bidirectional two-terminal elements 12 is omitted.

In the case where the display medium layer 20 is comprised of a solid matter (a light emitting layer of an organic EL display device, for instance), it is feasible to sequentially form the display medium layer 20 and second electrodes on the first substrate 10 obtained as described above. Furthermore, it is also feasible to place a protective layer and an opposed substrate as required. The method of forming the display medium layer 20 and the second electrodes 17 may be changed as appropriate according to the material used for the display device 100.

As it is possible to manufacture the display device 100 according to preferred embodiments of the present invention as described above, there is no need to make the bidirectional two-terminal elements 12 in the manufacturing process of the display device 100, so that the bidirectional two-terminal elements 12 separately or previously made may be used. To be more specific, the bidirectional two-terminal elements 12 can be independently made without being influenced by the size of the display device and the size or placement of the pixels. Therefore, the bidirectional two-terminal elements 12 can be made at a high density so that the bidirectional two-terminal elements 12 wasting no material and energy and having no variations in characteristics can be made.

In addition, as for the manufacturing process of the display device 100, if the illustrated process is adopted, a desired structure can be formed in a self-aligned manner by exposing the coating material 52 and insulating material 54 with the bidirectional two-terminal elements 12 randomly placed on the principal surface side of the first substrate 10 as the photomasks, and so there is no need for an expensive photolithographic apparatus and photomask alignment apparatus. Therefore, it is possible to manufacture an active matrix type display device more inexpensively and simply than before.

Hereafter, a description will be given by referring to FIGS. 4 to 11 as to further specific configurations and manufacturing methods of the display device according to preferred embodiments of the present invention. For simplification purposes, the components having substantially the same functions are indicated by the same reference numerals, and a description thereof will be omitted hereafter. The plan views of the various display devices shown in FIGS. 4 to 11 are substantially the same as FIG. 2.

Figure 4:
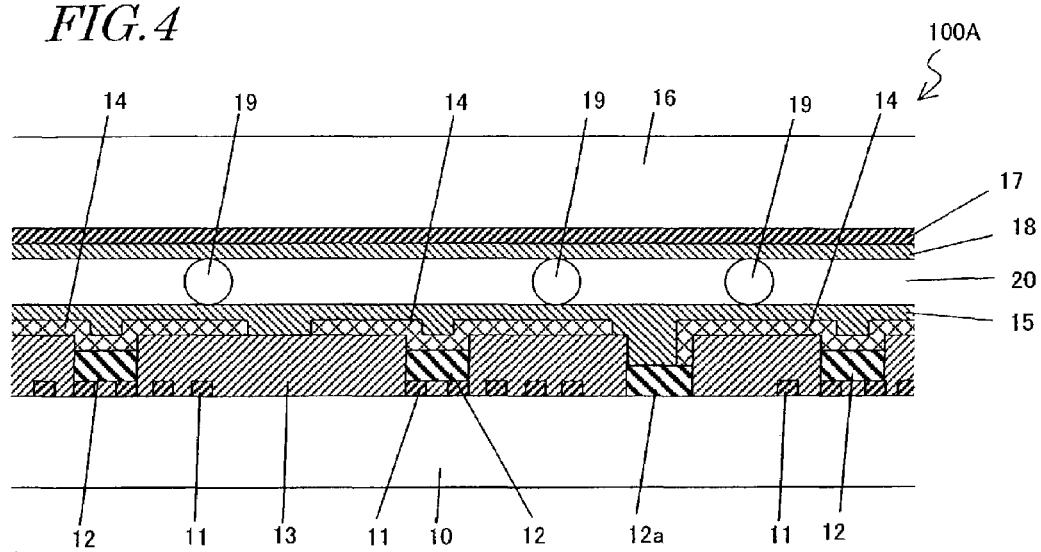
FIG. 4 is a schematic sectional view of a liquid crystal display 100A according to a preferred embodiment of the present invention.

FIG. 4 is a schematic sectional view of a liquid crystal display 100A according to a preferred embodiment of the present invention. The liquid crystal display 100A has the liquid crystal layer 20 as the display medium layer.

The first substrate 10 is a transparent substrate such as a glass substrate, a quartz substrate or a plastic substrate. The first electrodes 11 are preferably formed like stripes by using a transparent conductive material such as ITO or $SnO_2$ or a metallic material such as Al. Mo or Ta, for instance. While the thickness of the first electrodes 11 is set as appropriate according to the conductivity required for the material to be used and the first electrodes 11, it is preferably approximately 100 nm or more (about 300 nm, for instance).

The bidirectional two-terminal elements 12 are preferably substantially cylindrical with a diameter of approximately 11 $\mu$m for instance, and the first electrodes 11 are formed to have the spacing exceeding 11 $\mu$m. Therefore, the bidirectional two-terminal elements 12 are randomly placed prevent the adjacent first electrodes 11 from shorting out. In addition, the first electrodes 11 are preferably formed like slits having the openings 11a as shown in FIG. 2. To securely make electrical connections between the first electrodes 11 and the bidirectional two-terminal elements 12, the width of the opening 11a is preferably less than about 11 $\mu$m (approximately 10 $\mu$m for instance). Moreover, while the spacing between the adjacent openings 11a is preferably the same as the width of the opening 11a here as shown in FIG. 2, it is not limited thereto but is set as appropriate according to the conductivity (resistance value) required by the first electrodes 11. However, in the case of forming the first electrodes 11 by using a material which does not pass light, such as the metallic material, the distance between the adjacent openings 11a and so on should be set so that the light sufficiently reaches the photosensitive resin on the first electrodes 11 in order to adopt the underside exposure described by referring to FIG. 3A(e).

The interlayer insulation film 13 is formed on the insulating substrate 10 having the bidirectional two-terminal elements 12 placed thereon. The height of the bidirectional two-terminal element 12 is preferably approximately 3 $\mu$m, and the interlayer insulation film 13 is preferably formed to be thicker than it. The interlayer insulation film 13 is formed by the method described by referring to FIGS. 3A and 3B.

The picture electrodes 14 are subsequently formed. In the case of using transmitted light, a transparent conductive film such as ITO is formed as a film of about 100 nm to about 200 nm thickness, for example, patterned by the photolithographic process, and is etched with a solution including iron chloride and hydrochloric acid for instance so as to form the picture electrodes 14. In the case of using the reflected light, a metal film of Al and other suitable material, or a laminated metal film of Al/Mo or other suitable material is preferably formed. For instance, in the case of Al, it should be formed to have thickness of about 100 nm to about 200 nm or so, and in the case of the laminated metal film, it should be formed to have thickness of Al/Mo=about 100 nm to about 150 nm/about 50 nm to about 100 nm or so. Thereafter, it is patterned by the photolithographic process, and is etched with a solution including oxalic acid or other suitable material so as to form the picture electrodes 14.

Subsequently, a first orientation film 15 is formed as required. The first orientation film 15 is formed by forming a polyimide film through screen-printing and rubbing it in a predetermined direction.

As with the first substrate 10, the second substrate 16 preferably is also the transparent substrate such as the glass substrate, quartz substrate or plastic substrate. In the case of a reflective display device, however, it is sufficient that, of the first substrate 10 and the second substrate 16, the substrate placed on an observation side is at least translucent. The first substrate 10 and the second substrate 16 may also have a film-like configuration.

The second electrodes 17 provided on the liquid crystal layer 20 side of the second substrate 16 are preferably stripe-like transference electrodes 17. The transference electrode 17 is preferably comprised of ITO, $SnO_2$, or other suitable material and has thickness of approximately 100 nm or more. The direction in which the second electrodes 17 extend is preferably substantially perpendicular to the direction in which the first electrodes 11 extend, where each second electrode 17 overlaps the picture electrode 14 so that the overlapping portion constitutes an individual pixel. The second electrodes 17 may have a second orientation film 18 formed thereon as required. The first substrate 10 and the second substrate 16 are arranged so as to form a predetermined angle (approximately 90 degrees in the case of a TN mode, for instance) with the rubbing direction of the second orientation film 18 and that of the first orientation film 15.

In order to make the picture electrodes 14 and the second electrodes 17 mutually opposed, the first substrate 10 and the second substrate 16 are stuck together via a spacer 19. The thickness of the liquid crystal layer 20 is determined by adjusting the diameter of the spacer 19. The thickness of the liquid crystal layer 20 is preferably about 3.5 $\mu$m to about 5 $\mu$m or so for instance. The liquid crystal layer 20 is preferably formed by injecting a liquid crystal material between the first substrate 10 and the second substrate 16 and sealing it. The liquid crystal display 100A is thus obtained.

As described above, it is not necessary to manufacture the bidirectional two-terminal elements 12 in the manufacturing process of the liquid crystal display 100A so that, for instance, the bidirectional two-terminal elements 12 separately made in an existing semiconductor factory may be used. Therefore, the expensive equipment and apparatuses such as a plasma CVD apparatus essential in the manufacturing process of the liquid crystal displays in the past are unnecessary. Furthermore, the photolithographic process requiring correct alignment is only the step of patterning the picture electrodes 14, and so the steps requiring the correct photomask alignment are remarkably reduced. For this reason, the number of expensive photolithographic process apparatuses can be reduced, and a throughput is also improved. Thus, the liquid crystal display 100A according to preferred embodiments of the present invention can be manufactured at a lower cost than in the past. Furthermore, the first electrode 11 has the opening so as to prevent the degradation of display quality due to a parasitic capacitance formed between the first electrode 11 and picture electrode 14.

Figure 5:
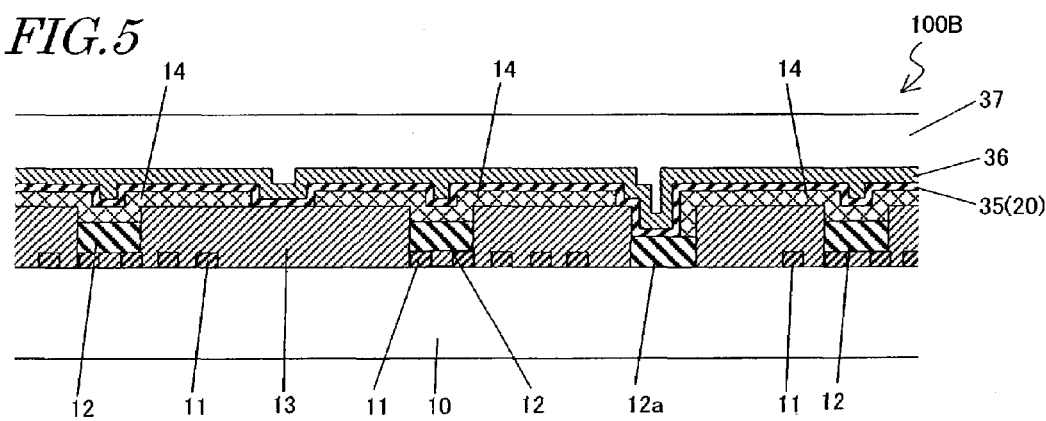
FIG. 5 is a schematic sectional view of an organic EL display device 100B according to a preferred embodiment of the present invention.

FIG. 5 shows a schematic sectional view of an organic EL display device 100B according to a preferred embodiment of the present invention.

The organic EL display device 100B has a light emitting layer 35 as the display medium layer 20. The display medium layer 20 may further include an electron hole transporting layer and/or an electron transporting layer in addition to the light emitting layer 35, where a public configuration of an organic EL element may be widely adopted. Display is performed by supplying a current to the display medium layer 20 (the light emitting layer 35) provided between the picture electrodes 14 and second electrodes 36. Moreover, a protective layer 37 for protecting the display medium layer 20 is formed to cover almost the entire surface of the first substrate 10. It is also possible to place the second substrate (not shown) instead of the protective layer 37 and join the first substrate 10 and the second substrate together by using a sealing agent or other suitable material so as to protect the light emitting layer 35.

The light emitting direction may be either the first substrate 10 side or the protective layer 37 side. In the case of emitting the light on the first substrate 10 side, the first substrate 10, first electrodes 11 and picture electrodes 14 are constituted by a transparent material, and the second electrodes 36 should be the reflectors. In the case of emitting the light on the protective layer 37 side, the picture electrodes 14 should be the reflectors, and the second electrodes 36 should be the transference electrodes. The first electrodes 11 may be formed with either a transparent conductive material or a metallic material. To adopt the underside exposure arrangement described by referring to FIG. 3A(e), however, the distance between the adjacent openings 11a and so on should be set so that the light sufficiently reaches the photosensitive resin on the first electrodes 11.

The organic EL display device 100B is manufactured by the following method, for instance. As the method described above by referring to FIGS. 3A(a)–(f) and 3B is performed up to the formation of the picture electrodes 14 and placement of the bidirectional two-terminal elements 12, a description thereof will be omitted here.

In the case the picture electrodes 14 are formed with the ITO, about 100 nm to about 200 nm in thickness of copper phthalocyanine, about 50 nm or so of a electron hole transporting material such as α-NPD, and about 50 nm or so of a light emitting material such as Alq3 (8-hydroxyquionoline aluminum) are sequentially laminated on the picture electrodes 14 so as to form the light emitting layer 35. It is also possible to form the light emitting layer 35 by sequentially laminating about 50 nm or so of the light emitting material such as Alq3, about 50 nm or so of the electron hole transporting material such as α-NPD (N,N-Di (naphthalene-1-yl)-N,N'-diphenyl-benzidine), and about 100 nm to about 200 nm of copper phthalocyanine on the picture electrodes 14.

Next, the second electrodes 36 are formed. In the case where the second electrodes 36 contact Alq3, Al is used as an electrode material, and film thickness thereof should be about 100 nm to about 200 nm. Thereafter, stripe-like patterning is performed in the photolithographic process to be substantially perpendicular to the first electrodes 11 and overlap the picture electrodes 14 so as to form the stripe-like second electrodes 36. In this case, it is also possible to perform the stripe-like patterning to the light emitting layer 35 by etching it using the second electrodes 36 as the masks.

In the case where the second electrodes 36 contact the copper phthalocyanine, Au is used as an electrode material, and film thickness thereof should be about 100 nm to about 200 nm. Thereafter, the stripe-like patterning is performed in the photolithographic process to be substantially perpendicular to the first electrodes 11 and overlap the picture electrodes 14 so as to form the stripe-like second electrodes 36. In this case, it is also possible to perform the stripe-like patterning to the light emitting layer 35 by etching it using the second electrodes 36 as the masks.

In the case where the picture electrodes 14 are formed by using Al or Al/Mo, about 50 nm or so of the light emitting material such as Alq3, about 50 nm or so of the electron hole transporting material such as α-NPD, and about 100 nm to about 200 nm of copper phthalocyanine are sequentially laminated on Al so as to form the light emitting layer 35.

Next, the second electrodes 36 are formed with the ITO, and the film thickness thereof should be about 100 nm or more. The stripe-like patterning is performed in the photolithographic process to be substantially perpendicular to the first electrodes 11 and overlap the picture electrodes 14 so as to form the stripe-like second electrodes 36. In this case, it is also possible to perform the stripe-like patterning to the light emitting layer 35 by etching it with the second electrodes 36 as the masks.

Subsequently, the protective layer 37 is formed. Because the protective layer 37 needs to have a property of filtering out no moisture, a silicon nitride film is grown by the CVD method or other suitable process, for instance, and the film thickness thereof should be about 3 μm or so. Thereafter, the terminal portion is exposed in order to apply an electrical signal to the first electrodes 11 and the second electrodes 36. The protective layer 37 of the first electrodes 11 and the second electrodes 36 positioned outside the display area and the light emitting layer 35, if remaining, are eliminated. In this case, it is possible to eliminate the silicon nitride film either by wet etching with buffered hydrofluoric acid or other suitable material or by dry etching with $CF_4$, for instance.

Figure 6:
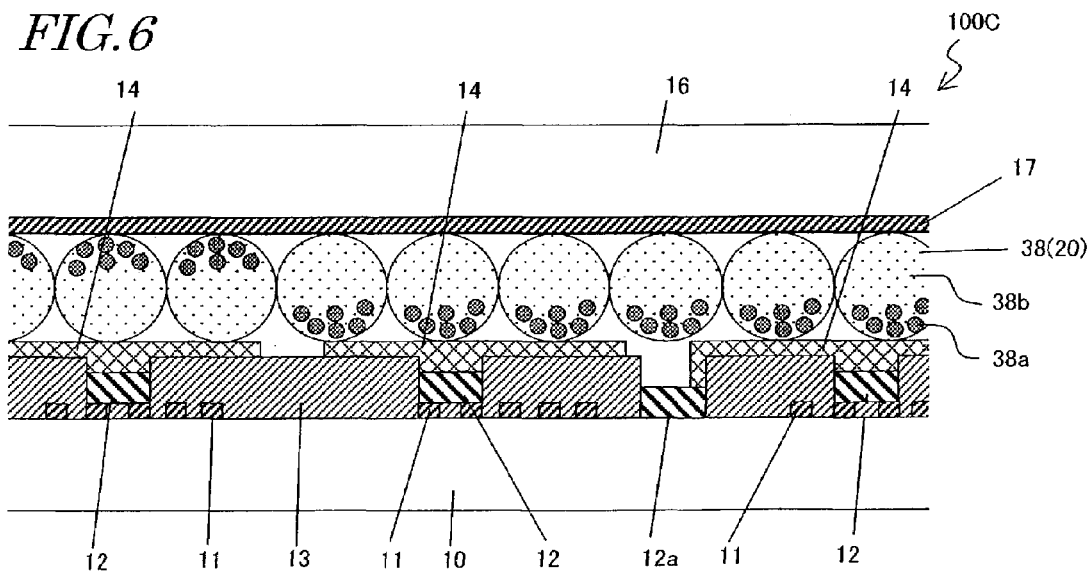
FIG. 6 is a schematic sectional view of a microcapsule-type electrophoresis display device 100C according to a preferred embodiment of the present invention.

FIG. 6 is a schematic sectional view of a microcapsule-type electrophoresis display device 100C according to a preferred embodiment of the present invention.

The display medium layer 20 of the electrophoresis display device 100C has a microcapsule 38. The microcapsule 38 formed with a transparent material has white particles 38a and blue liquid 38b encapsulated therein. As for the microcapsule 38, the one disclosed in Japanese Patent Laid-Open No. 1-86116 may be suitably used, for instance. A voltage is applied between the picture electrodes 14 and second electrodes 17, and black and white color particles are electrophoresed so as to display an image comprised of white and blue.

As it can be made by the same method as the one described by referring to FIGS. 3A(a)–(f) and 3B other than using the microcapsule 38 as the display medium layer 20, a description of the manufacturing method will be omitted. Moreover, the picture electrode 14 may be either the transference electrode or reflector. In addition, the display medium layer 20 comprised of the microcapsule 38 can be implemented by using a public coating method or other suitable method.

FIG. 7 is a schematic sectional view of a toner display device 100D according to a preferred embodiment of the present invention.

The display medium layer 20 of the toner display device 100D has a black toner 39 and white particles 40. For instance, sphere-like resin particles containing a carbon black pigment is used for the black toner 39, and a sphere-like resin particles containing a titanium oxide pigment is used for the white particles 40. An image comprised of black and white is displayed by applying the voltage between the picture electrodes 14 and second electrodes 17 and moving the black and white color particles between the substrates. The basic principle of operation of the toner display device is described in the collected papers Japan Hardcopy 2001 for instance.

As it can be made by the same method as the one described by referring to FIGS. 3A(a)–(f) and 3B other than using a mixture of the black toner 39 and white particles 40 as the display medium layer 20, a description of the manufacturing method thereof will be omitted. Moreover, the display medium layer 20 is formed by, after dispersing the black toner 39 and white particles 40 on the surfaces of the first substrate 10 or second substrate 16, joining these substrates together by providing a predetermined spacing, for instance. The picture electrode 14 may be either the transference electrode or reflector.

FIG. 8 is a schematic sectional view of a twist-ball-method display device 100E according to a preferred embodiment of the present invention.

The twist-ball-method display device 100E has a layer in which two-color particles 41 are dispersed in the resin (silicone resin for instance) as the display medium layer 20. As for the two-color particles 41, the white side becomes negatively charged and the black side becomes positively charged, for instance, so as to form an electric doublet. It performs the display by changing the orientation of the two-color particles 41 according to the voltage between the picture electrodes 14 and second electrodes 17. The basic principle of operation of the twist-ball-method display device is described in U.S. Pat. No. 4,126,854, for instance.

As it can be made by the same method as the one described by referring to FIGS. 3A(a)–(f) and 3B other than using the resin layer in which two-color particles 41 are dispersed as the display medium layer 20, a description of the manufacturing method will be omitted. Moreover, the display medium layer 20 is formed by, after coating the surfaces of the first substrate 10 or second substrate 16 with the resin layer in which the two-color particles 41 are dispersed, joining these substrates together, for instance. The picture electrode 14 may be either the transference electrode or reflector.

Figure 9:
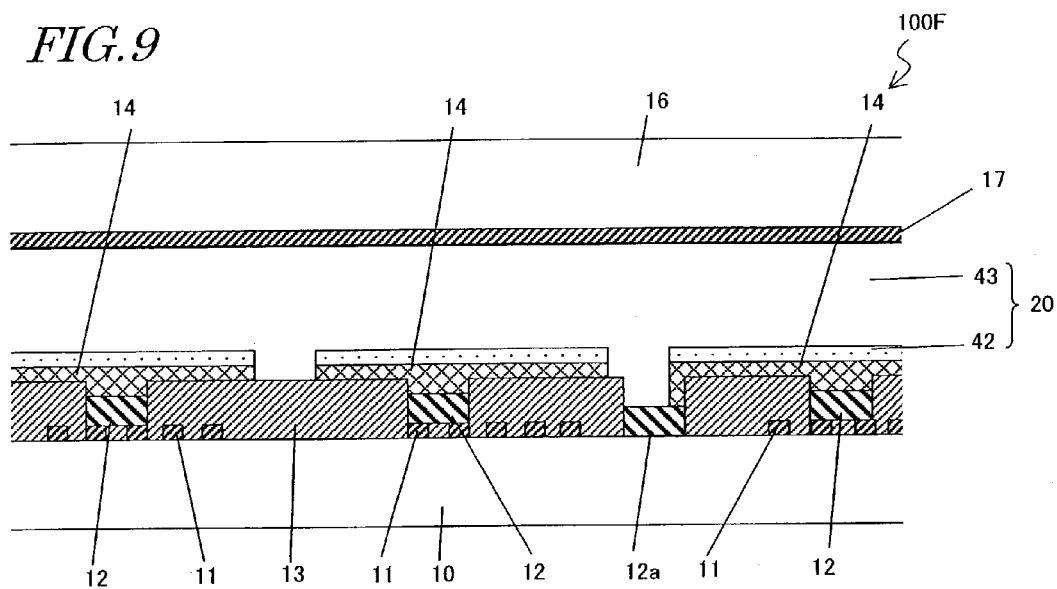
FIG. 9 is a schematic sectional view of an electrochromic display device 100F according to a preferred embodiment of the present invention.

FIG. 9 is a schematic sectional view of an electrochromic display device 100F according to a preferred embodiment of the present invention.

The display medium layer 20 of the electrochromic display device 100F is preferably comprised of a $WO_3$ layer 42 of approximately 0.3 μm to approximately 1.0 μm thickness and an electrolytic layer 43 such as lithium perchlorate. It performs the display by an electrochromic reaction of the $WO_3$ layer according to the voltage applied between the picture electrodes 14 and second electrodes 17. The basic principle of operation of the electrochromic display device is described in Philos. Mag. vol. 27, p. 801 (1973), for instance.

As it can be made by the same method as the one described by referring to FIGS. 3A and 3B other than using the $WO_3$ layer 42 and electrolytic layer 43 as the display medium layer 20, a description of the manufacturing method will be omitted. Moreover, the display medium layer 20 is formed by, after joining together the first substrate 10 having the $WO_3$ layer 42 formed on the picture electrodes 14 and second substrate 16, injecting the electrolyte in the gap thereof. The picture electrode 14 may be either the transparent electrode or reflector.

Figure 10:
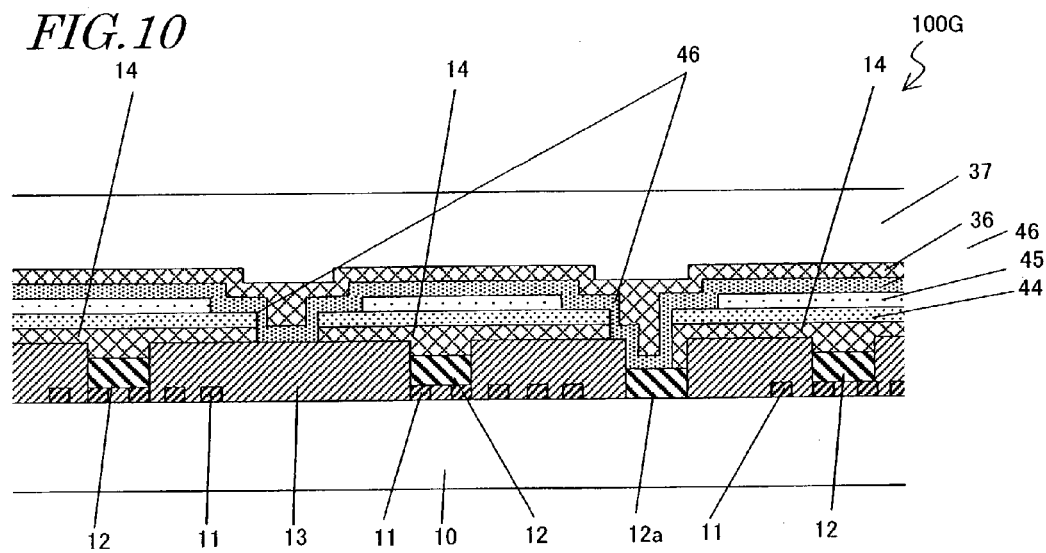
FIG. 10 is a schematic sectional view of a display device 100G using a porous Si according to a preferred embodiment of the present invention.

FIG. 10 is a schematic sectional view of a display device 100G using a porous silicon according to a preferred embodiment of the present invention.

The display medium layer 20 of the display device 100G using the porous silicon is formed with a Si layer 44 formed on the picture electrodes 14, a porous Si layer 45 formed on the Si layer 44, and a SiNx layer 46 formed on the porous Si layer 45. It performs the display as the porous Si layer 45 emits the light according to the voltage applied between the picture electrodes 14 and second electrodes 36. Si is originally an indirect-transition semiconductor which does not generally emit the light. However, if the crystalline particle diameter of Si becomes about 10 nm or less, the electrons and holes are trapped in so that direct-transition recombination occurs and it emits the light (refer to Applied Physics Letters, vol. 57, p. 1046, 1990 and Applied Physics Letters, vol. 60, p. 347, 1992, for instance). The display device 100G is formed so that the protective layer 37 for protecting the display medium layer 20 covers almost the entire surface of the first substrate 10.

As it can be made by the same method as the one described by referring to FIGS. 3A(a)–(f) and 3B other than using the Si layer 44, porous Si layer 45 and SiNx layer 46 as the display medium layer 20, a description of the manufacturing method will be omitted. Moreover, the Si layer 44 is formed by, after being deposited by using a public film deposition technology, patterning it by the dry etching method with $HCl+SF_6$ mixed gas. The porous Si layer 45 is formed, for instance, by forming an anode of the porous Si in an HF water solution (a current density of about 20 mA/cm$^2$ for instance). It can also be formed by depositing Si like dots by the plasma CVD method. The picture electrode 14 may be either the transference electrode or reflector.

Figure 11:
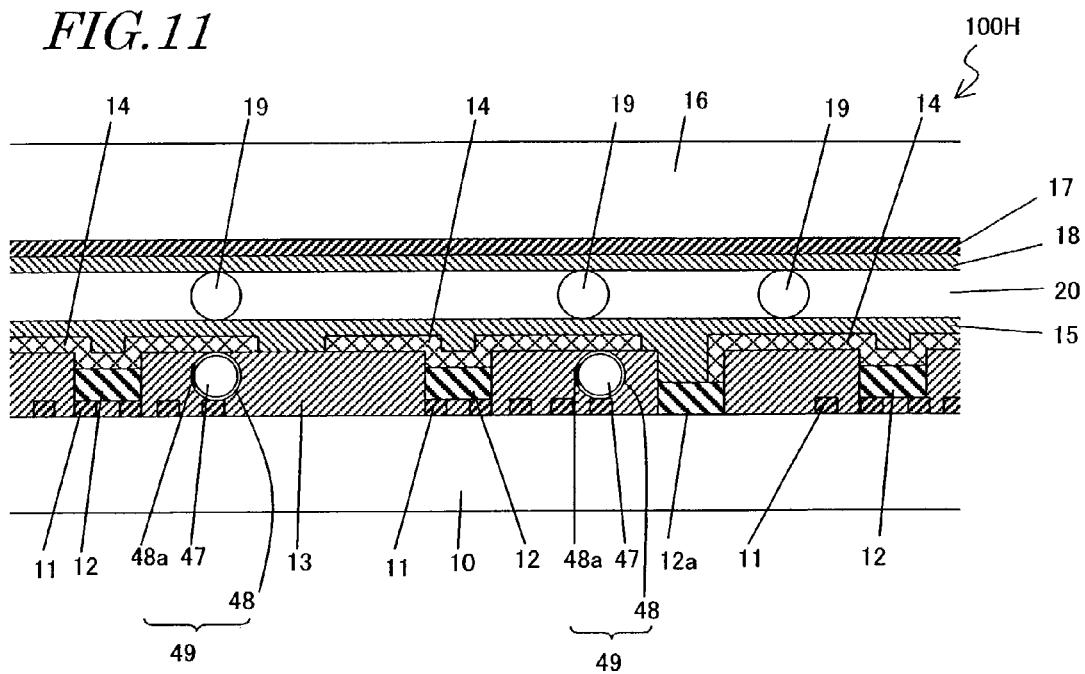
FIG. 11 is a schematic sectional view of a light-scanning liquid crystal display 100H according to a preferred embodiment of the present invention.

FIG. 11 is a schematic sectional view of a light-scanning liquid crystal display 100H according to a preferred embodiment of the present invention.

The liquid crystal display 100H has light leading paths 49 arranged substantially parallel with the first electrodes 11. The light leading path 49 is placed on one end of the first electrode 11 in the width direction, and has a high refractive index portion 48a on the other end side in the width direction of the first electrode 11 of a cladding 48 covering a core 47 of the light leading path 49. The light emitted from the high refractive index portion 48a side enters from a side surface of the semiconductor laminated structure of the bidirectional two-terminal element 12 so that the bidirectional two-terminal elements 12 will be in an on state. The bidirectional two-terminal element 12 used here does not have the light shielding layer 28 on its side surface. The high refractive index portion 48a is formed, for instance, by partially ion-exchanging the cladding 48. Other configuration may be substantially the same as the liquid crystal display 100A shown in FIG. 4.

The liquid crystal display 100H is manufactured as follows for instance. As-described by referring to FIGS. 3A and 3B, after forming the first electrodes 11, the light leading paths (optical fiber) 49 made in advance are arranged substantially parallel with the first electrodes 11. As for the process thereafter, the liquid crystal display 100H is obtained by undergoing the same process as that of the liquid crystal display 100A. Moreover, the picture electrode 14 is the reflector.

While the light-scanning liquid crystal display was illustrated, an addressing method using the light is applicable to other display devices as well. An optical address display device to which the present invention is applicable is described in Japanese Patent Laid-Open No. 6-301050 for instance.

Bidirectional Two-Terminal Element

A description will be given by referring to FIGS. 12A and B and FIGS. 13A to E as to the structure and manufacturing method of the bidirectional two-terminal element 12 suitably used for the display devices according to various preferred embodiments of the present invention. While the bidirectional thyristor is illustrated here, any bidirectional two-terminal element having the same functions may be used for the above-mentioned display devices.

Figure 12A:
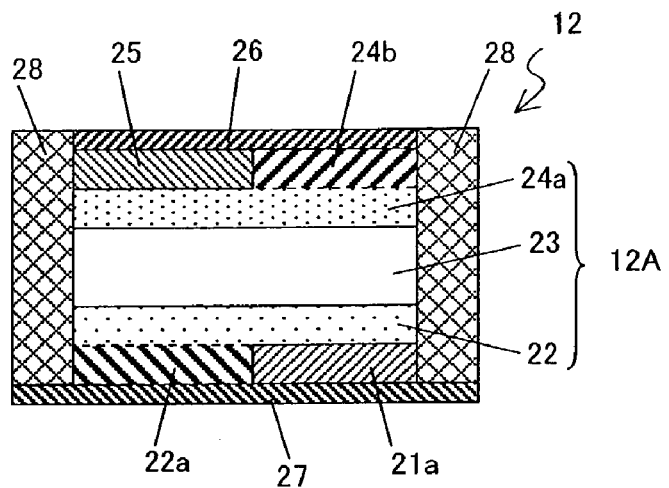
FIGS. 12A, B and C are schematic sectional views of bidirectional two-terminal elements 12, 12' and 12" suitably used for the display device according to a preferred embodiment of the present invention respectively.
Figure 12B:
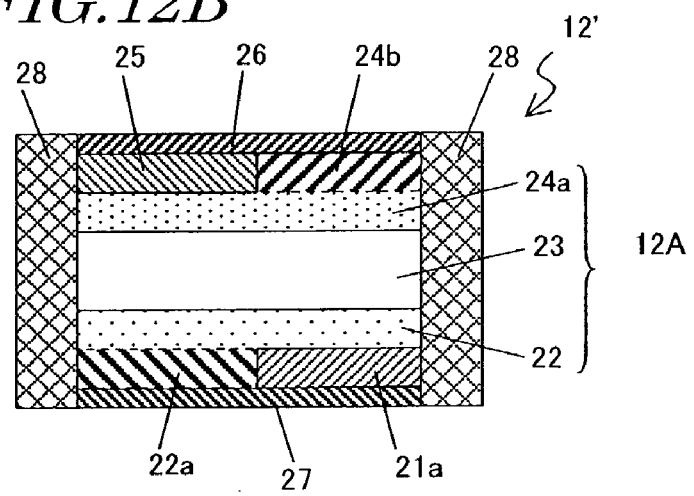

As schematically shown in the sectional views of the structure in FIGS. 12A and B, the bidirectional two-terminal element 12 and 12' have a pair of electrodes 26 and 27 and a laminated semiconductor structure 12A disposed between them. The laminated semiconductor laminated structure 12A has vertically symmetrical layers that are formed one on top of the other. Furthermore, the light shielding layer, 28 is formed on the side surface of the semiconductor laminated structure 12A. In the case of optically addressing the bidirectional two-terminal element 12 as with the liquid crystal display 100H, the light shielding layer 28 is omitted.

The bidirectional two-terminal element 12 should preferably be substantially cylindrical, for instance, so that, when placing it on the substrate, the electrodes 26 or 27 can be stably placed in contact with the surface of the substrate. The diameter of the substantially cylindrical element 12 should preferably be larger than the height, and it should desirably be about three times or more. For instance, the diameter is about 11 $\mu$m or so and the height is about 3 $\mu$m or so.

The laminated semiconductor structure 12A has, between the electrodes 27 and 26, a region wherein a first conductive-type first semiconductor layer 21a, a second conductive-type second semiconductor layer 22, a first conductive-type third semiconductor layer 23, a second conductive-type fourth semiconductor layer 24a and a second conductive-type fifth semiconductor layer 24b are laminated in this order from the electrode 27 side, and a region wherein a second conductive-type first semiconductor layer 22a, a second conductive-type second semiconductor layer 22, a first conductive-type third semiconductor layer 23, a second conductive-type fourth semiconductor layer 24a and a first conductive-type second semiconductor layer 25 are laminated in this order.

The bidirectional two-terminal element according to preferred embodiments of the present invention is suitably manufactured by the following method.

First, the substrate having the insulating layer and the semiconductor layer on that insulating layer is prepared. A bidirectional semiconductor laminated structure having a predetermined shape including the semiconductor layer is formed on the insulating layer. The method described later may be suitably used as the method of forming the bidirectional semiconductor laminated structure. A first electrode layer is formed on the obtained bidirectional semiconductor laminated structure, and the first electrode layer is adhered to another substrate. The bidirectional semiconductor laminated structure is separated from the substrate by eliminating the insulating layer in a state of having the first electrode layer adhered. To be more specific, the bidirectional semiconductor laminated structure is transferred to the other substrate. Thereafter, a second electrode layer is formed on the semiconductor layer of the bidirectional semiconductor laminated structure so as to obtain the bidirectional two-terminal element.

A first manufacturing method of the bidirectional two-terminal element 12 will be described by referring to FIGS. 13A to E.

Figure 13A:
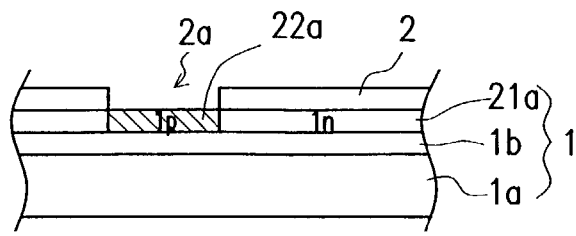
FIGS. 13A to E are schematic sectional views for explaining the manufacturing method of the bidirectional two-terminal elements 12 and 12' according to a preferred embodiment of the present invention respectively.

First, as shown in FIG. 13A, a substrate 1 having an insulating layer 1b and the first conductive-type (n) first semiconductor layer 21a on the insulating layer 1b is prepared. The insulating layer 1b is an embedded layer of oxides, for instance. Impurities are selectively injected into the semiconductor layer 21a via a mask 2 having an opening 2a so as to form a second conductive-type first semiconductor region 22a.

Figure 13B:
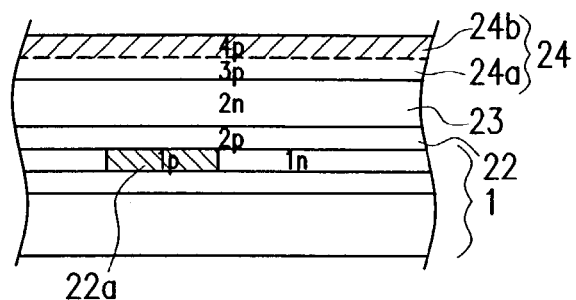

Next, as shown in FIG. 13B, the second conductive-type second semiconductor layer 22 is deposited on the first semiconductor layer 21a including the first semiconductor region 22a. Subsequently, the first conductive-type third semiconductor layer 23 is deposited on the second semiconductor layer 22. Furthermore, the second conductive-type fourth semiconductor layer 24a is formed on the third semiconductor layer 23, and the second conductive-type fifth semiconductor layer 24b having higher density of impurities than the fourth semiconductor layer 24a is formed on the fourth semiconductor layer 24a.

Figure 13C:
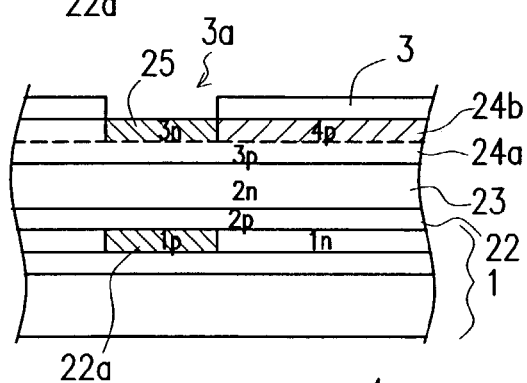

Next, as shown in FIG. 13C, the impurities are selectively injected via a mask 3 having an opening 3a so as to form a first conductive-type second semiconductor region 25 in the region located on the first semiconductor region 22a of the fifth semiconductor layer 24b.

Figure 13D:
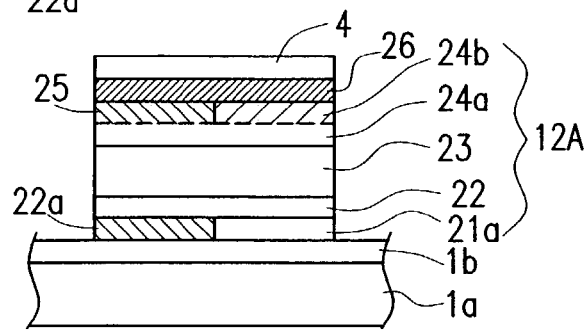

Next, as shown in FIG. 13D, a first electrode layer 26 is formed on the fifth semiconductor layer 24b including the second semiconductor layer 25. Thereafter, a mask 4 having predetermined shape is used to perform etching up to the insulating layer 1b and thereby pattern the first electrode layer 26, second semiconductor region 25, fifth semiconductor layer 24b, fourth semiconductor layer 24a, third semiconductor layer 23, second semiconductor layer 22, first semiconductor region 22a and first semiconductor layer 21a in predetermined shape so as to obtain the semiconductor laminated structure 12A having a predetermined shape on the insulating layer 1b.

Figure 13E:
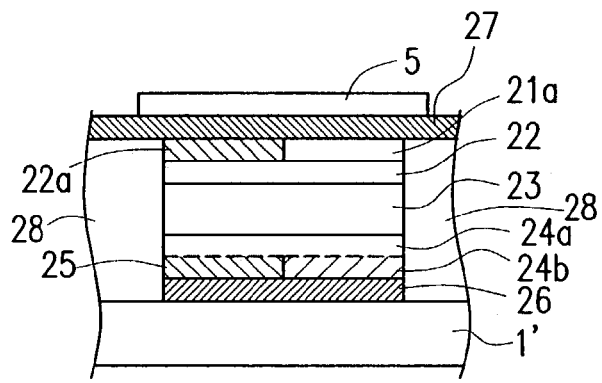

Thereafter, as shown in FIG. 13E, the first electrode layer 26 is adhered to the other substrate 1'. The semiconductor laminated structure 12A is separated from the substrate 1' by eliminating the insulating layer 1b in a state of having the first electrode layer 26 adhered to the other substrate 1'. Thereafter, the light shielding layer 28 is formed to cover the separated semiconductor laminated structure 12A.

Subsequently, a portion of the light shielding layer 28 is eliminated and the surfaces of the first semiconductor layer 21a and first semiconductor region 22a of the semiconductor laminated structure 12A are thereby exposed so as to form a second electrode layer 27 on the surfaces of the exposed first semiconductor layer 21a and first semiconductor region 22a of the semiconductor laminated structure 12A. Thereafter, a mask 5 having a predetermined shape is used to pattern a portion of the second electrode layer 27 and light shielding layer 28 having a predetermined shape so as to obtain the bidirectional two-terminal elements 12 shown in FIG. 12A.

It is possible, by controlling the material, thickness and density of impurities of each layer (or region) constituting the semiconductor laminated structure 12A, to adjust a turn-on voltage of the bidirectional two-terminal elements 12.

Hereafter, a description will be given, by referring to FIGS. 13A to E again, as to the specific manufacturing method of the bidirectional two-terminal element 12 suitably used for the display devices 100A, 100B, 100F to 100H.

An n-type silicon wafer 1 having an embedded oxide film layer 1b is masked with an oxide film 2 or other suitable material to protect a first n-type region 21a, and the impurities capable of forming a p-type layer such as boron are introduced so as to form a first p-type region 22a. In this case, the density of impurities of the first p-type region 22a should be in ohmic contact between it and the second metal electrode layer 27.

After eliminating the mask, a second p-type region 22 is grown by the CVD method or other suitable process. Thereafter, a second n-type region 23 is grown by the CVD method or other suitable method. In this case, the density of impurities and film thickness of the second n-type region 23 are appropriately selected to render the turn-on voltage of the bidirectional two-terminal elements 12 as an appropriate voltage for driving. For instance, the density of impurities of the second n-type region 23 is preferably about $5.7 \times 10^{16}$ $cm^{-3}$, for example, completion of element production and the film thickness is rendered about 590 nm or more so that the turn-on voltage of the bidirectional two-terminal elements can be about 15V or so.

After forming the second n-type region 23, the third p-type region 24a is grown by the CVD method or other suitable process. In this case, the density of impurities of an upper region 24b of the third p-type region 24a is rendered to be in ohmic contact with the first metal electrode 26.

Thereafter, an oxide film 3 having the opening 3a is formed at a position equivalent to a third n-type region 25 on the fourth p-type region 24b, and the impurities capable of forming a n-type region such as phosphorus is introduced so as to form the third n-type region 25.

Thereafter, the first metal electrode 26 is film-formed by a sputtering method or other suitable process. In this case, Ti, W or other suitable material are selected for instance so that the first metal electrode 26 is in ohmic contact with the fourth p-type region 24b and third n-type region 25. It may also be the laminated structure such as Al/Ti or ITO/Ti.

Thereafter, the patterning is performed by the photolithographic process or other suitable process, and the etching is performed until it reaches the embedded oxide film layer 1b by means of dry etching or other suitable process. In this case, a substantially round shape is desirable as the shape of the patterning, but it may also be another shape.

Thereafter, the first metal electrode 26 is adhered to the other substrate 1' and the embedded oxide film layer 1b is eliminated by the buffered hydrofluoric acid or other suitable material so as to transfer the semiconductor laminated structure 12A to the other substrate 1'.

Thereafter, the light shielding layer 28 is film-formed with a resin capable of light shielding and so on. After film-forming the light shielding layer 28, polishing is performed by the chemical mechanical polishing (CMP) method or other suitable process until the first n-type region 21a and the first p-type region 22a appear so as to film-form a metal film 27 thereafter. In this case, Ti, W or other suitable material are selected for instance so that the metal film 27 is in ohmic contact with the first p-type region 22a and first n-type region 21a. It may also be the laminated structure such as Al/Ti or ITO/Ti.

Thereafter, the patterning is performed by the photolithographic process or other suitable process, and the etching is performed by dry etching or other suitable process until reaching the other substrate 1' having the first metal electrode 26 adhered thereto so as to form the second metal electrode 27 and light shielding layer 28. While the patterning shape is preferably a substantially round shape in this case, the shape may be arbitrary if corresponding to the arbitrary shape on the above patterning. In addition, although the light shielding layer 28 is substantially perpendicular in FIG. 12, it may be inclined. It is also feasible to form the oxide film, nitride film or other suitable material as a protective coat between the light shielding layer 28 and each semiconductor layer.

As for the above manufacturing method, the following method may be used in the case of using a transparent substrate as the other substrate 1' after transferring the-semiconductor laminated structure 12A to the other substrate 1'. In the case of using the following method, a bidirectional two-terminal element 12' having the structure shown in FIG. 12B can be obtained.

After transferring the semiconductor laminated structure 12A to the other substrate 1', it is coated with a negative type photoresist so as to perform the exposure from the underside of the other substrate 1' and develop it. The photoresist of the portion corresponding to the semiconductor laminated structure 12A is thereby eliminated.

Thereafter, the second metal electrode 27 is film-formed by a sputtering method or other suitable process. In this case, Ti, W or other suitable material are selected, for instance, so that the second metal electrode 27 is in ohmic contact with the first p-type region 22a and first n-type region 21a. It may also be the laminated structure such as Al/Ti or ITO/Ti.

Thereafter, the photoresist is eliminated so that the second metal electrode 27 on the photoresist is lifted off and only remains on the semiconductor laminated structure 12A. Hereafter, the light shielding layer 28 is formed and the patterning is performed by the same method as described above.

The bidirectional two-terminal element 12' may be obtained by flaking the first metal electrode 26 from the other substrate 1'.

The bidirectional two-terminal elements 12 and 12' are formed so that the density of impurities thereof becomes $N_{A22a} \geq N_{A24b} > N_{D25} \geq N_{D21a} \geq N_{A22} \leq N_{A24a} > N_{D23}$=about $1.5 \times 10^{17}$ $cm^{-3}$. In this case, $N_{A22a}$, $N_{A24b}$, $N_{D25}$, $N_{D21a}$, $N_{A22}$, $N_{A24a}$ and $N_{D23}$ are the densities of impurities of the semiconductor layers or regions 22a, 24b, 25, 21a, 22, 24a and 23 respectively. In addition, the bidirectional two-terminal element 12 is preferably formed so that the film thicknesses of the layers thereof become, for example, $d_{21a}$=about 400 nm, $d_{22a}$=about 400 nm, $d_{22}$=about 400 nm, $d_{24b}$=about 400 nm, $d_{24a}$=about 400 nm, $d_{25}$=about 400 nm, $d_{26}$=about 400 nm and $d_{27}$=about 400 nm, and $d_{23}$ becomes about 590 nm or more. In this case, $d_{21a}$, $d_{22a}$, $d_{22}$, $d_{23}$, $d_{24b}$, $d_{24a}$ and $d_{25}$ are the film thicknesses of the respective regions 21a, 22a, 22, 23, 24b, 24a and 25, and $d_{26}$ and $d_{27}$ are the film thicknesses of the first metal electrode 26 and the second metal electrode 27. The light shielding layer 28 is preferably formed to have a thickness of about 30 nm or so. The light shielding layer 28 may be either substantially perpendicular or inclined. However, the light shielding layer 28 is not formed on the bidirectional two-terminal elements 12 and 12' used for the light-scanning display device such as the display device 100H.

It becomes possible, by making the bidirectional two-terminal elements 12 to have a high density by the above-described method, to use the materials more efficiently than making the display device by the method in the past.

For instance, if the semiconductor laminated structure 12A has an approximately 10-μm diameter and is made in an approximately 11-μm cycle, the metal film and semiconductor film to be wasted is about 30 percent or so. The efficiency is dramatically improved as opposed to the cases in the past where, as the switching element is made in the manufacturing process of the liquid crystal display, nearly 90 percent of the metal film and semiconductor film is wasted in order to increase the open area ratio.

A second manufacturing method of the bidirectional two-terminal element 12 will now be described.

The method uses the substrate 1 having a single-crystal silicon membrane 21a of approximately 1-μm thickness affixed to a base material 1a via a silicon oxide film 1b. In this case, the single-crystal silicon membrane 21a is an n-type semiconductor of which density of impurities should be adequately selected so as to render the turn-on voltage of the bidirectional two-terminal elements 12 suited to driving. For instance, it is possible to make the turn-on voltage of the bidirectional two-terminal elements 12 about 7.5V or so by making the density of impurities about $1.5 \times 10^{17}$ cm$^{-3}$ or so.

By ion doping, the impurities capable of forming a p-type layer such as boron are introduced to the substrate 1 so as to form the p-type layer corresponding to the first p-type region 22a. In this case, the acceleration voltage of ion implantation is adjusted so as to form the p-type layer corresponding to the first p-type region 22a at a desired depth and with a desired film thickness. In addition, the density of impurities of the p-type layer should be in ohmic contact between the first p-type region 22a and second metal electrode 27.

Next, the impurities capable of forming the p-type layer such as the boron are introduced by an ion doping method so as to form the second p-type region 22. In this case, the acceleration voltage of ion implantation is adjusted so as to form the second p-type area 22 of a desired film thickness at a desired depth.

Next, the impurities capable of forming the p-type layer such as the boron are introduced by the ion doping method so as to form the third p-type region 24a. In this case, the acceleration voltage of ion implantation is adjusted so as to form the third p-type area 24a of a desired film thickness at a desired depth.

Next, the impurities capable of forming the p-type layer such as the boron are introduced by the ion doping method so as to form the p-type layer corresponding to the fourth p-type region 24b. In this case, the acceleration voltage of ion implantation is adjusted so as to form the p-type layer corresponding to the fourth p-type region 24b at a desired depth with a desired film thickness. In addition, the density of impurities of the p-type layer should be the ohmic contact between the fourth p-type region 24b and first metal electrode 26.

Next, on the surface of the substrate, a mask is formed with the oxide film or other suitable material at a position corresponding to the first p-type region 22a, and the impurities capable of forming the n-type region such as phosphorus is introduced so as to have the depth and film thickness corresponding to the p-type layer corresponding to the first p-type region 22a by adjusting the acceleration voltage by using the ion doping method. The first p-type region 22a and the first n-type region 21a are thereby formed.

Thereafter, the oxide film is eliminated, and on the surface of the substrate, the mask is formed with the oxide film or other suitable material at the position corresponding to the fourth p-type region 24b. Thereafter, the impurities capable of forming the n-type layer such as phosphorus are introduced so as to have the depth and film thickness corresponding to the p-type layer corresponding to the fourth p-type region 24b by adjusting the acceleration voltage by using the ion doping method. The fourth p-type region 24b and the third n-type region 25 are thereby formed.

Next, the oxide film is eliminated. Thereafter, annealing is performed at an adequate temperature in order to activate the above introduced impurities.

In the above, the following method may be used from the process of forming the p-type layer corresponding to the fourth p-type region 24b onward.

On the surface of the substrate, the impurities capable of forming the n-type layer such as phosphorus are introduced by the ion doping method so as to form the n-type layer corresponding to the third n-type region 25. In this case, the acceleration voltage of the ion implantation is adjusted so as to form the n-type layer corresponding to the third n-type region 25 of a desired film thickness at a desired depth.

Next, the mask is formed with the oxide film or other suitable material at a position corresponding to the first p-type region 22a, and the impurities capable of forming the n-type layer such as phosphorus are introduced so as to have the desired depth and film thickness by adjusting the acceleration voltage by using the ion doping method. The first p-type region 22a and the first n-type region 21a are thereby formed.

Subsequently, the impurities capable of forming the p-type region such as boron are introduced so as to have the depth and film thickness corresponding to the n-type layer corresponding to the third n-type region 25 by adjusting the acceleration voltage by using the ion doping method. The third n-type region 25 and the fourth p-type region 24b are thereby formed. In this case, the density of impurities of the fourth p-type region 24b should be in ohmic contact with the first metal electrode 26.

Next, the oxide film is eliminated. Thereafter, annealing is performed at an adequate temperature in order to activate the introduced impurities described above.

Thereafter, the first metal electrode 26 is film-formed by the sputtering method or other suitable process. In this case, Ti, W or other suitable material are preferably selected, for instance, so that the first metal electrode 26 is in ohmic contact with the fourth p-type region 24b and the third n-type region 25. It may also be the laminated structure such as Al/Ti or ITO/Ti.

Thereafter, the patterning is performed by the photolithographic process or other suitable process, and the etching is performed by the dry etching or other suitable process until reaching the silicon oxide film. While the preferable patterning shape is preferably round in this case, it may also be another shape.

Hereafter, as described above, the semiconductor laminated structure 12A is transferred to the other substrate 1', and the second metal electrode 27 and light shielding layer 28 are formed so as to obtain the bidirectional two-terminal element 12 or 12'.

The bidirectional two-terminal elements 12 and 12' are formed so that the density of impurities thereof becomes $N_{A22a} \geq N_{A24b} > N_{D25} \geq N_{D21a} \geq N_{A22} \leq N_{A24a} > N_{D23}$. In this case, $N_{A22a}$, $N_{A24b}$, $N_{D25}$, $N_{D21a}$, $N_{A22}$, $N_{A24a}$ and $N_{D23}$ are the densities of impurities of the regions 22a, 24b, 25, 21a, 22, 24a and 23 respectively. The bidirectional two-terminal element 12 is preferably formed so that the film thicknesses of the layers thereof become, for example, $d_{21a}$=about 200 nm, $d_{22a}$=about 200 nm, $d_{22}$=about 200 nm, $d_{24b}$=about 200 nm, $d_{24a}$=about 200 nm, $d_{25}$=about 200 nm, $d_{26}$=about 400 nm and $d_{27}$=about 400 nm, and $d_{23}$ becomes about 260 nm or more. In this case, $d_{21a}$, $d_{22a}$, $d_{22}$, $d_{23}$, $d_{24b}$, $d_{24a}$ and $d_{25}$ are the film thicknesses of the respective regions 21a, 22a, 22, 23, 24b, 24a and 25, and $d_{26}$ and $d_{27}$ are the film thicknesses of the first metal electrode 26 and the second metal electrode 27. The light shielding layer 28 is preferably formed to have a thickness of about 300 nm or so. The light shielding layer 28 may be either substantially perpendicular or inclined. The light shielding layer 28 may be either substantially perpendicular or inclined. However, the light shielding layer 28 is not formed on the bidirectional two-terminal elements 12 and 12' used for the light-scanning display device such as the display device 100H.

It is desirable that the bidirectional two-terminal elements 12 and 12' suitably used for the electrophoresis display device 100C and toner display device 100D have a turn-on voltage of about 50V or so. The layers are preferably formed so that the densities of impurities thereof become $N_{A22a} \geq N_{A24b} > N_{D25} \geq N_{D21a} \geq N_{A22} \leq N_{A24a} > N_{D23} \leq$ about $1.16 \times 10^{16}$ cm$^{-3}$, for instance. The layers are preferably formed so that the film thicknesses thereof become, for example, $d_{21a}$=about 1.6 µm, $d_{22a}$=about 1.6 µm, $d_{22}$=about 1.6 µm, $d_{23}$=about 2.4 µm or more, $d_{24b}$=about 1.6 µm, $d_{24a}$=about 1.6 µm, $d_{25}$=about 1.6 µm, $d_{26}$=about 380 nm and $d_{27}$=about 380 nm or so.

It is desirable that the bidirectional two-terminal elements 12 and 12' suitably used for the twist-ball-method display device 100E have a turn-on voltage of about 250V or so. The layers are preferably formed so that the densities of impurities thereof become, for example, $N_{A22a} \geq N_{A24b} > N_{D25} \geq N_{D21a} \geq N_{A22} \leq N_{A24a} > N_{D23} \leq$ about $1.36 \times 10^{15}$ cm$^{-3}$. The layers are preferably formed so that the film thicknesses thereof become $d_{21a}$=about 10 µm, $d_{22a}$=about 10 µm, $d_{22}$=about 10 µm, $d_{23}$=about 15.5 µm or more, $d_{24b}$=about 10 µm, $d_{24a}$=about 10 µm, $d_{25}$=about 10 µm, $d_{26}$=about 380 nm and $d_{27}$= about 380 nm or so. The light shielding layer 28 is formed to have a thickness of about 300 nm or so. The light shielding layer 28 may be either substantially perpendicular or inclined. The light shielding layer 28 may be either about perpendicular or inclined. However, the light shielding layer 28 is not formed on the bidirectional two-terminal elements 12 and 12' used for the light-scanning display device such as the display device 100H.

Thus, it is possible to make the bidirectional two-terminal elements 12 and 12' of various turn-on voltages by adjusting the semiconductor layer materials, densities of impurities and thicknesses.

Figure 12C:
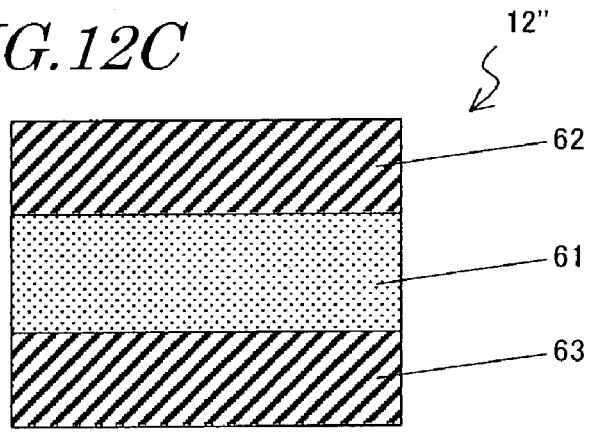

It is also possible to use the MIM element 12" shown in FIG. 12C as the bidirectional two-terminal element.

The MIM element 12" has a first metal electrode 62, a second metal electrode 63 and the insulating layer 61 disposed between the first metal electrode 62 and second metal electrode 63. The MIM element 12" is made as follows for instance.

The metal film comprised of Ta or other suitable material (to be the second metal electrode) is film-formed on the insulating substrate such as the glass substrate at the film thickness of about 300 nm or so by the sputtering method. Next, this metal film is anodized to form the oxide film (to be the insulating layer 61). The metal film comprised of Ta or other suitable material (to be the first metal electrode) is film-formed at the film thickness of about 200 nm or so on the oxide film by the sputtering method. A layered object thereby, obtained is patterned by the photolithographic process for instance in predetermined shape, and it is flaked from the insulating substrate thereafter so as to obtain the MIM element 12".

Driving Methods of the Display Devices

Driving methods of the display devices 100A, 100B and 100F to 100H having the bidirectional two-terminal element 12 made as mentioned above will be described.

First, the liquid crystal display 100A is driven as follows, for instance. A description will be given by referring to FIG. 14 as to the case of, for instance, applying an arbitrary gradation voltage to in the liquid crystal layer 20 at the maximum voltage of about 5V when the turn-on voltage of the bidirectional two-terminal element 12 is about 15V.

The turn-on voltage of about 15V of the bidirectional two-terminal element 12 is applied to the n-th first electrode 11 of total k pieces of the first electrode 11 for a very short time. The time for applying the voltage for putting the bidirectional two-terminal element 12 in the on state (scanning voltage) is about 1 µsec to about 2 µsec, for instance. The bidirectional two-terminal element 12 on the n-th first electrode 11 is thereby turned on, and the picture electrodes 14 corresponding to the n-th first electrode 11 are electrically connected to the n-th first electrode 11. Moreover, the voltage applied to the n-th first electrode 11 should be 0V after applying the voltage of about 15V thereto for a very short time.

During the period when the scanning voltage is applied to the n-th first electrode 11 (that is, the period when the n-th first electrode 11 is selected), a desired voltage (signal voltage) is applied to each of the plurality of second electrodes 17 crossing the first electrodes 11. FIG. 14 shows the electrical signal (signal voltage) applied to the m-th and m+1-th second electrodes 17. The polarity of the signal voltage is a reverse polarity to the voltage applied to the n-th first electrode 11 (scanning voltage), and the time for application is approximately, 1/(60×k) sec, for example.

During the period when the n-th first electrode 11 is selected, the liquid crystal layer 20 between each of the picture electrodes 14 connected the n-th first electrode 11 and the second electrodes 17 opposed to each of the picture electrodes 14 is charged with the desired voltage applied to the second electrodes 17. If the liquid crystal layer 20 is sufficiently charged, the current running in the bidirectional two-terminal element 12 connected to each of the picture electrodes 14 is reduced so that the bidirectional two-terminal element 12 is put in an off state when lower than a certain current value. Thus, the voltage charged to the liquid crystal layer 20 between each of the picture electrodes 14 on the n-th first electrode 11 and the second electrodes 17 corresponding to each of them is maintained. As the bidirectional two-terminal element 12 is in the off state, the voltage applied to the liquid crystal layer 20 a picture electrode 14 corresponding to the n-th first electrode and the opposing second electrode 17 does not change even if the voltage applied to the second electrodes 17 changes.

Subsequently, the same operation as described above is performed as to the (n+1)-th first electrode 11 approximately 1/(60×k) sec. after applying the voltage to the n-th first electrode 11 so that the liquid crystal layer between the picture electrodes 14 on the (n+1)-th first electrode 11 and the second electrodes 17 opposed to each of them is charged with the desired voltage.

This is repeated k times so as to display one screen (one frame or field). Here, the time required to constitute one screen (one frame) is preferably about 1/60 (sec.) as a typical example.

As shown in FIG. 14, it is desirable to reverse the polarities of the scanning voltage applied to the n-th first electrode 11 and (n+1)-th first electrode 11 so as to obtain a high-quality image. Furthermore, if the voltage of the same polarity continues to be applied to the liquid crystal layer 20, it causes "burning" of the display. Therefore, it is desirable that the voltage to be applied for the sake of displaying a next screen (frame) have the reverse polarity as to each of the first electrode 11 and second electrodes 17 (frame reverse drive or field reverse drive).

Figure 15:
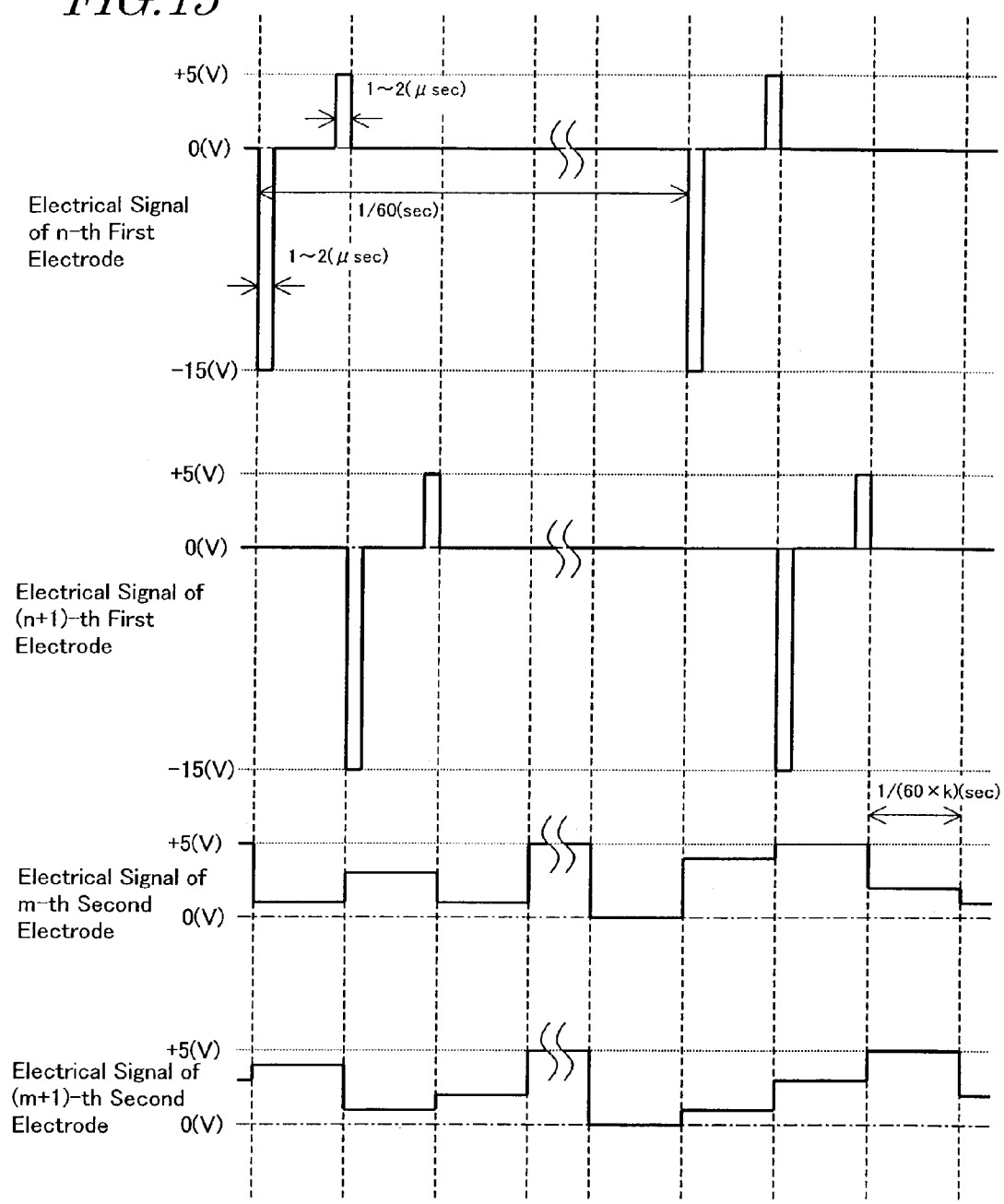
FIG. 15 is a diagram showing the waveform and timing of the electrical signal for explaining the driving method of the organic EL display device 100B.

The organic EL display device 100B shown in FIG. 5 is driven as follows, for instance. A description will be given by referring to FIG. 15 as to the driving method when the turn-on voltage of the bidirectional two-terminal element 12 is about −15V and the voltage applied to the organic EL layer (light emitting layer) 35 is arbitrary between about 0 to about +5V, by taking as an example the case where an electron hole injection layer of the copper phthalocyanine or other suitable material is connected on the second electrode 36 side and the light emitting material such as Alq3 is connected on the picture electrode 14 side.

The turn-on voltage of about 15V of the bidirectional two-terminal element 12 is applied to the n-th first electrode 11 of total k pieces of the first electrode 11 for a very short time. The time for applying the voltage for putting the bidirectional two-terminal element 12 in the on state (scanning voltage) is about 1 μsec to about 2 μsec for instance. There is no problem of visibility if the time for application is to this extent. The bidirectional two-terminal element 12 on the n-th first electrode 11 is thereby turned on, and the picture electrodes 14 corresponding to the n-th first electrode 11 are electrically connected to the n-th first electrode 11. Moreover, the voltage applied to the n-th first electrode 11 should be 0V after applying the voltage of about 15V thereto for a very short time.

During the period when the scanning voltage is applied to the n-th first electrode 11, a desired voltage (signal voltage) is applied to each of the plurality of second electrodes 17 crossing the first electrodes 11.

During the period when the n-th first electrode 11 is selected, the current according to the desired voltage applied to the second electrodes 36 runs in the light emitting layer 35 between each of the picture electrodes 14 connected the n-th first electrode 11 and the second electrodes 36 opposed to each of the picture electrodes 14 so as to emit the light.

Next, to stop the light emission after desired time, the voltage of about +5V or so is applied to the n-th first electrode 11 for about 1 μsec to about 2 μsec or so, so that the current running in the bidirectional two-terminal element 12 connected to the picture electrodes 14 on the n-th first electrode 11 is reversed or reduced, and the bidirectional two-terminal element 12 is thereby put in the off state so as to stop the light emission. The time from applying the voltage of about −15V to the n-th first electrode 11 to finishing applying the voltage of about +5V thereto is approximately 1/(60×k) sec., for instance.

Subsequently, the same operation as that described above is performed as to the (n+1)-th first electrode 11 approximately 1/(60×k) sec. after applying the voltage to the n-th first electrode 11 so that the organic EL layer 35 between the picture electrodes 14 on the (n+1)-th first electrode 11 and the second electrodes 36 opposed to each of them emits the light. This is sequentially repeated k times so as to display one screen (one frame or field).

In the case where the light emitting material such as Alq3 is connected to the second electrode 36 and the electron hole injection layer of the copper phthalocyanine or other suitable material is connected to the picture electrodes 14, all the polarities of the above applied voltage should be the opposite polarities.

In the case of the display device 100G using the porous silicon shown in FIG. 10, a negative voltage is applied to the first electrode 11 side, and a positive voltage is applied to the second electrode 36 side so that, by the same driving method as the above, the light is emitted from the porous silicon layer 45 and thereby performs the display.

Figure 16:
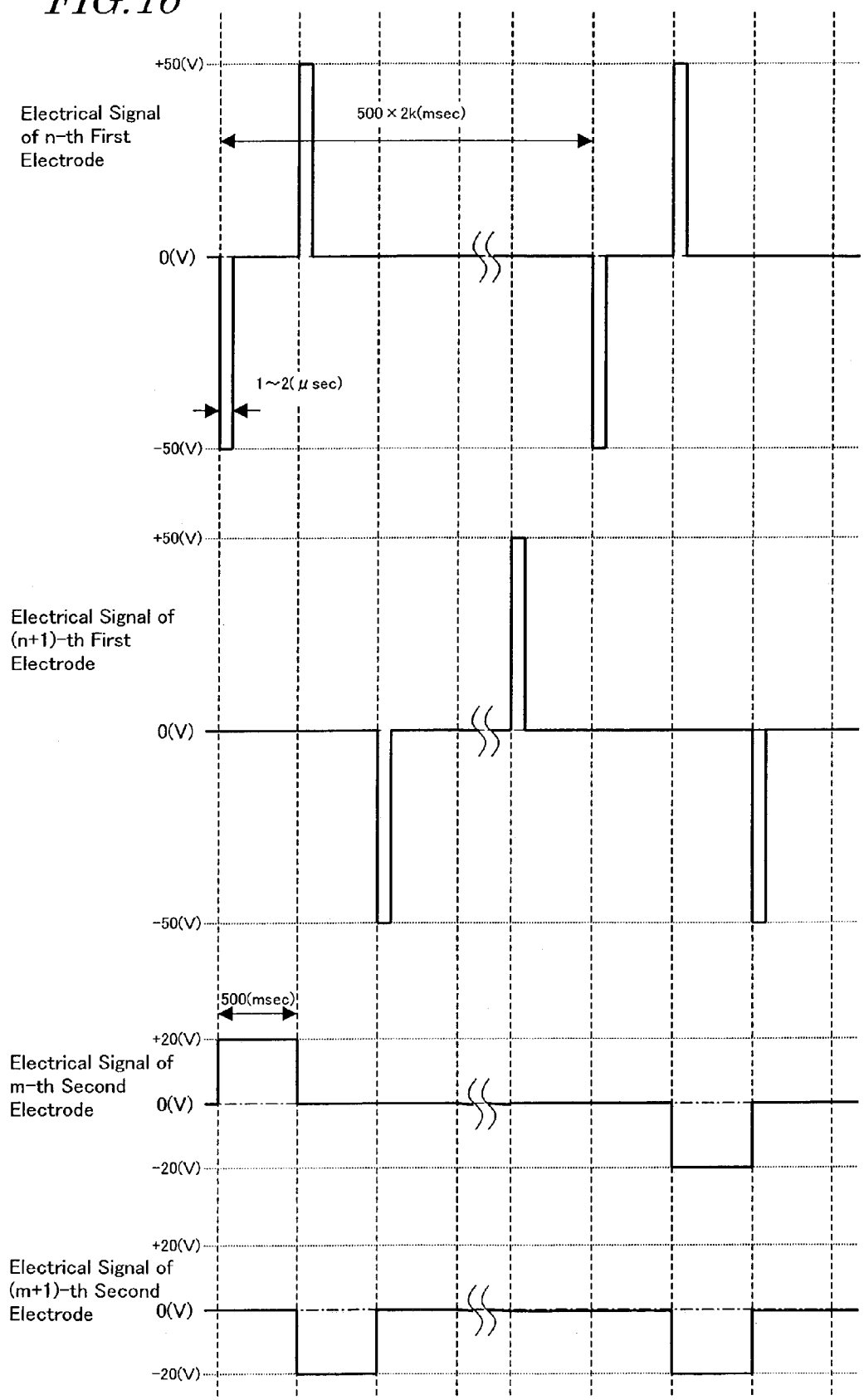
FIG. 16 is a diagram showing the waveform and timing of the electrical signal for explaining the driving method of the microcapsule-type electrophoresis display device 100C.

Next, the driving method of the microcapsule-type electrophoresis display device 100C shown in FIG. 6 will be described by referring to FIG. 16. Here, the turn-on voltage of the bidirectional two-terminal elements 12 is preferably about 50V, and the voltage applied to the display medium layer 20 (microcapsule 38) is preferably about 20V.

The turn-on voltage of about −50V of the bidirectional two-terminal element 12 is applied to the n-th first electrode 11 of the total k pieces of the first electrode 11 for a very short time. The time for applying the voltage for putting the bidirectional two-terminal element 12 in the on state (scanning voltage) is about 1 μsec to about 2 μsec, for instance. The bidirectional two-terminal element 12 on the n-th first electrode 11 is thereby turned on, and the picture electrodes 14 corresponding to the n-th first electrode 11 are electrically connected to the n-th first electrode 11. Moreover, the voltage applied to the n-th first electrode 11 should be 0V after applying the voltage of about 15V thereto for a very short time.

During the period when the scanning voltage is applied to the n-th first electrode 11 (that is, the period when the n-th first electrode 11 is selected), about 20V is applied to the second electrodes 17 including the pixels for performing white display of the plurality of second electrodes 17 crossing the first electrode 11. The time for applying the signal voltage is about 500 msec for instance.

During the period when the n-th first electrode 11 is selected, the microcapsule 38 between the picture electrodes 14 connected to the n-th first electrode 11 and the second electrodes 17 having the voltage for the white display applied thereto is charged with the desired voltage applied to the second electrodes 17. If the microcapsule 38 is sufficiently charged, the current running in the bidirectional two-terminal element 12 connected to each of the picture electrodes 14 is reduced so that the bidirectional two-terminal element 12 is put in an off state when lower than a certain current value. Thus, the voltage charged to the microcapsule 38 between the picture electrodes 14 on the n-th first electrode 11 and the second electrodes 17 corresponding to each of them is maintained to perform the white display. As the bidirectional two-terminal element 12 is in the off state, the voltage applied to the microcapsule 38 between the picture electrodes 14 corresponding to the n-th first electrode 11 and the second electrodes 17 opposed thereto does not change even if the voltage of the second electrodes 17 changes.

As for the pixels for performing blue display of the n-th first electrode 11, the voltage of about 50V is applied to the n-th first electrode 11 and the voltage of about −20V is applied to the second electrodes 17 approximately 500 msec after applying the above voltage for the white display to the n-th first electrode 11. The time for applying the signal voltage is approximately 500 msec as with the above-described process.

The same operation as described above is performed as to the (n+1)-th first electrode 11 approximately 500×2 msec. after applying the voltage to the n-th first electrode 11 so that the microcapsule 38 between the picture electrodes 14 on the (n+1)-th first electrode 11 and the second electrodes 17 opposed to each of them is charged with the desired voltage.

This is repeated k times so as to display one screen (one frame or field). The time required to constitute one screen (one frame) is preferably set as approximately (500×2 k) msec.

The toner display device 100D shown in FIG. 7 is preferably driven by the same method as the above electrophoresis display device 100C. However, the time for applying the signal voltage to the second electrodes 17 may be about 1 msec or so. The toner display device 100D performs black and white display.

The twist-ball-method display device 100E shown in FIG. 8 is preferably also driven by the same method as the above electrophoresis display device 100C. However, the turn-on voltage of the bidirectional two-terminal elements 12 is preferably about 250V, the scanning voltage applied to the first electrode 11 is preferably about −250V, the signal voltage applied to the second electrodes 17 is preferably about ±100V, and the time for applying the signal voltage is preferably about 100 msec.

The electrochromic display device 100F shown in FIG. 9 is also driven by the same method as the above electrophoresis display device 100C. However, the turn-on voltage of the bidirectional two-terminal elements 12 is preferably about 15V, the scanning voltage applied to the first electrode 11 is preferably about ±15V, the signal voltage applied to the second electrodes 17 is preferably about ±5V, and the time for applying the signal voltage is preferably about 500 msec.

In the case of the light-scanning liquid crystal display 100H shown in FIG. 11, unlike the above-mentioned liquid crystal display 100A (FIG. 4), no scanning voltage is applied to the first electrode 11, which is constantly in a state of 0V. Instead of applying the scanning voltage to the first electrode 11, the light is introduced to the optical fiber 49, and the introduced light is irradiated from the high refractive index portion 48a to the bidirectional two-terminal element 12 which is then turned on. It is driven just as the liquid crystal display 100A except that the first electrode 11 is selected by the light.

The display devices using the display medium layers other than the liquid crystal displays are the light-scanning display devices likewise, and are driven likewise.

As mentioned above, it is preferable to use a bidirectional thyristor as a bidirectional two-terminal element. However, a bidirectional MIM can also be used. The bidirectional thyristor is advantageous because of its bistability which provides high quality display image. Instead, an MIM is rather cheap.

A driving method (driving wave form) for a display device having a bidirectional MIM element is used as a bidirectional two-terminal element will be described herein after.

Figure 17:
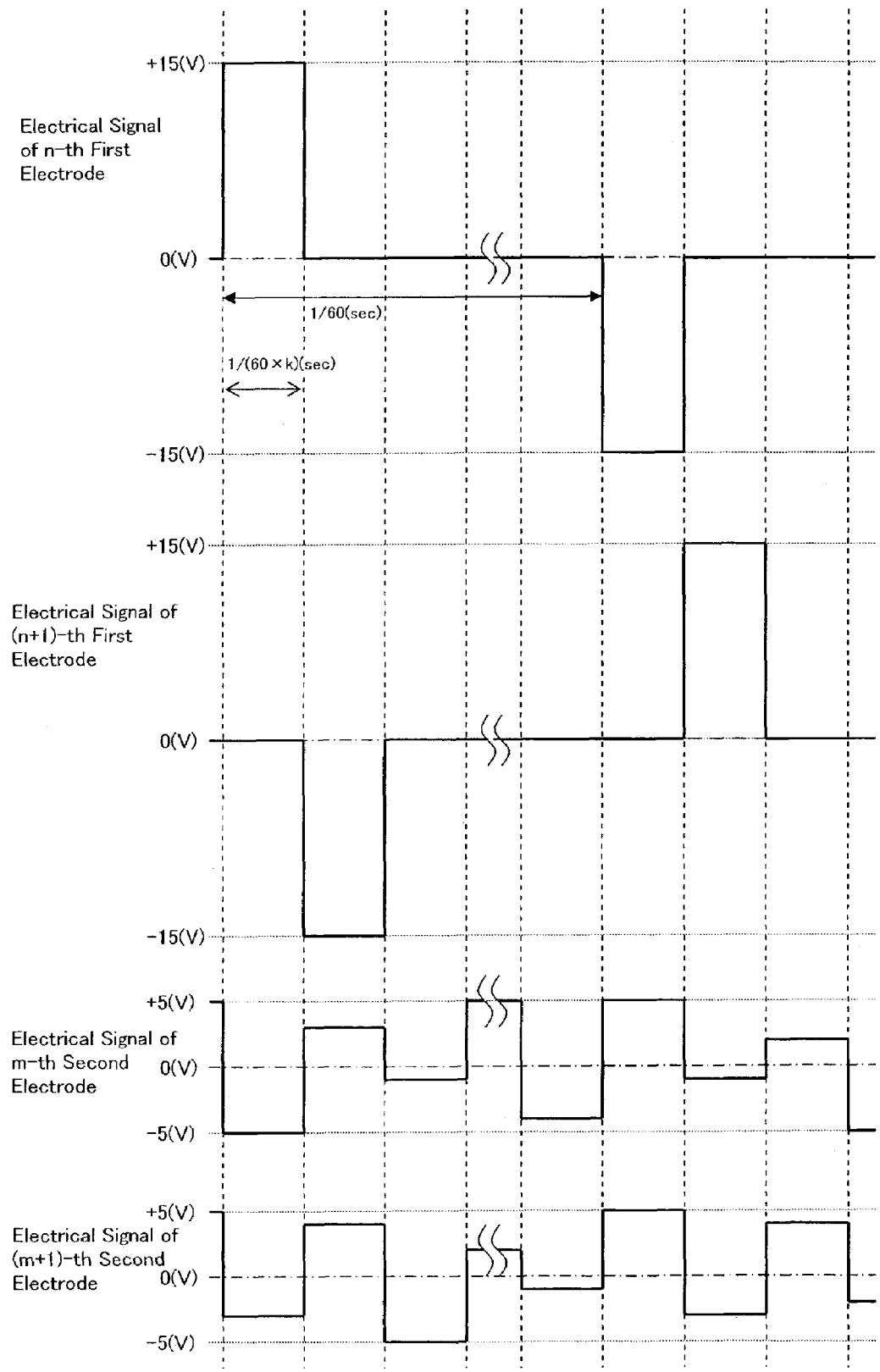
FIG. 17 is a diagram showing the waveform and timing of the electrical signal for explaining the driving method of the liquid crystal display device.

FIG. 17 is a diagram showing the waveform and timing of the electrical signal for explaining the driving method of the liquid crystal display 100A. In this example, a bidirectional MIM element having a turn-on voltage of about 15V is used.

A voltage of about 15V is applied to the n-th first electrode of total k pieces of the first electrode. At the same time, a desired voltage is applied to each of the second electrodes simultaneously. The voltage applied to the second electrodes has a sign opposite to that of the voltage applied to the n-th first electrode. The time period for the voltage application is preferably about 1/(60*k) (sec).

By applying the voltages to the first and second electrodes, the MIM element corresponding to the pixel electrode 14 at the cross point of the n-th first electrode and each of the second electrodes is turned on. As a result, the desired voltage is applied to the liquid crystal layer between the pixel electrode 14 and the corresponding second electrode.

The above-mentioned operation is performed to the (n+1)-th first electrode, then a desired voltage is applied to the liquid crystal layer between the pixel electrode 14 and the corresponding second electrode.

One image (one frame image) is formed by repeating these operations by k times.

For example, the time that is necessary in order to form one frame image is approximately 1/60 (sec).

In addition, it is desirable to reverse the polarities of the voltage applied to the n-th first electrode and (n+1)-th first electrode so as to obtain a high-quality image.

Furthermore, if the voltage of the same polarity continues to be applied to the liquid crystal layer, it causes "burning" of the display. Therefore, it is desirable that the voltage to be applied for the sake of displaying a next image (frame) has the reverse polarity as to each of the first electrode and second electrodes (frame reverse drive).

Figure 18:
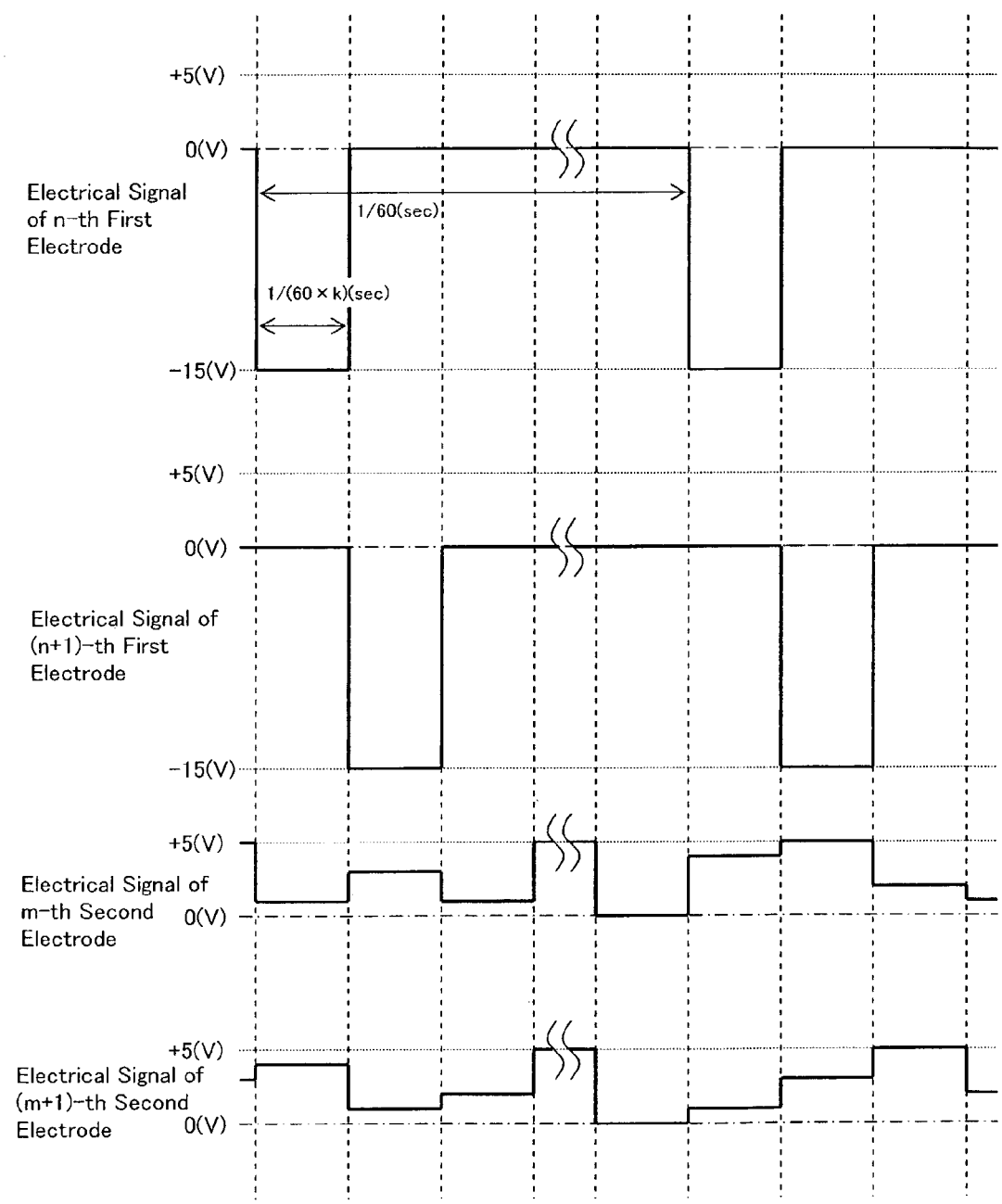
FIG. 18 is a diagram showing the waveform and timing of the electrical signal for explaining the driving method of the organic electroluminescent display made with porous Si.

FIG. 18 is a diagram showing the waveform and timing of the electrical signal for explaining the driving method of the organic electroluminescent display made with porous Si.

In this example, a bidirectional MIM element having a turn-on voltage of about 15V is used.

A voltage of about 15V is applied to the n-th first electrode of total k pieces of the first electrode. At the same time, a desired voltage is applied to each of the second electrodes simultaneously. The voltage applied to the second electrodes has a sign opposite to that of the voltage applied to the n-th first electrode. The time period for the voltage application is approximately 1/(60*k) (sec).

By applying the voltages to the first and second electrodes, the MIM element corresponding to the picture electrode 14 at the cross point of the n-th first electrode and each of the second electrodes is turned on. As a result, the desired current flows through the organic EL layer between the picture electrode and the corresponding second electrode and the organic EL layer emits light.

The above-mentioned operation is performed to the (n+1)-th first electrode, then a desired current flows through the organic layer between the pixel electrode 14 and the corresponding second electrode and the organic layer emits light.

One image (one frame image) is formed by repeating these operations by k times.

For example, the time that is necessary in order to form one frame image is approximately 1/60 (sec).

In the case of the display device using a porous silicon, a negative voltage is applied to the first electrode side, and a positive voltage is applied to the second electrode so that, by the same driving method as the above, the light is emitted from the porous silicon layer and thereby perform the display.

Figure 19:
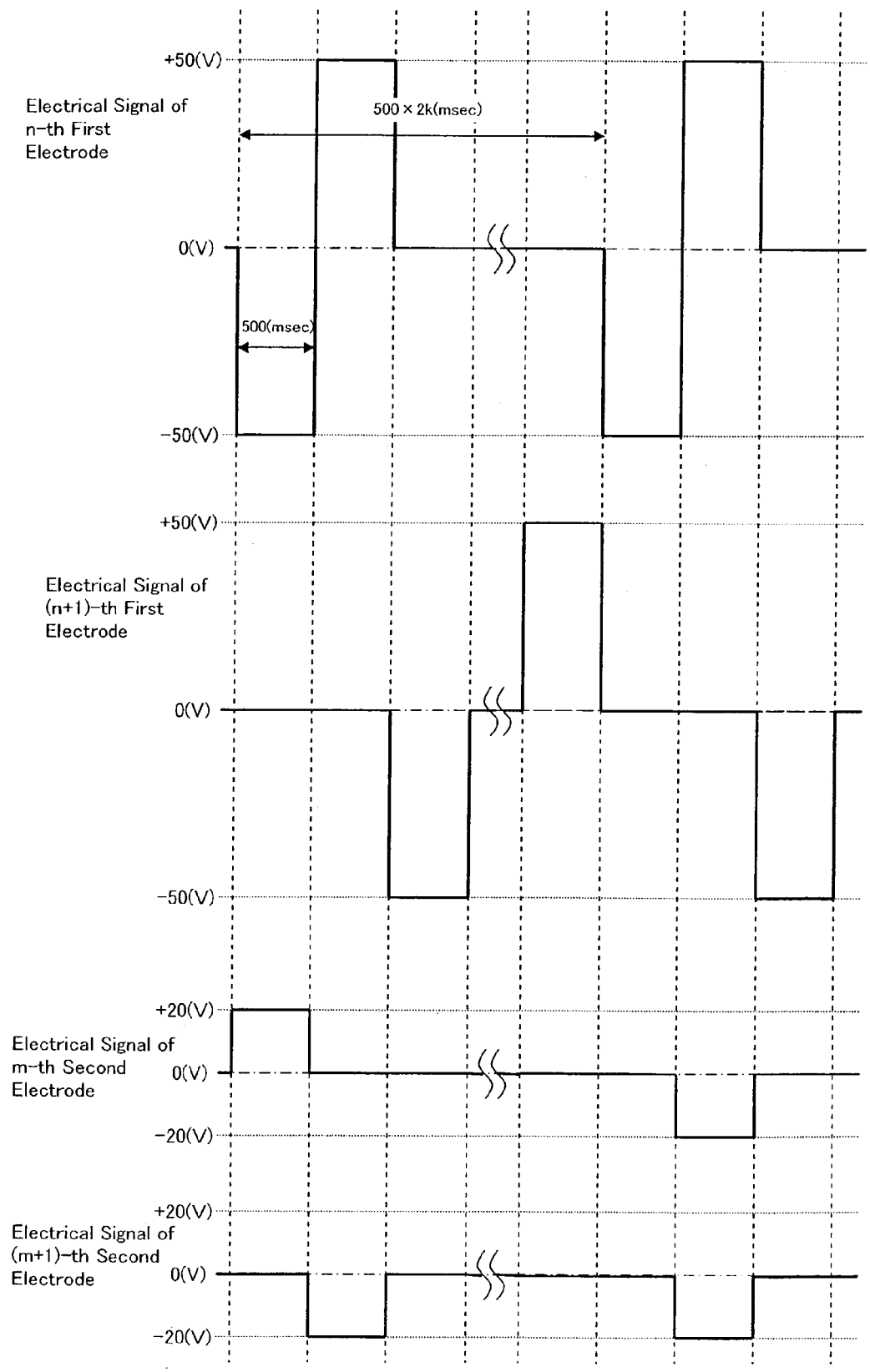
FIG. 19 is a diagram showing the waveform and timing of the electrical signal for explaining the driving method of any of the microcapsule-type electrophoresis display device, or alternatively, for a toner display device, a twist ball type display device, or an electrochromic display device.

FIG. 19 is a diagram showing the waveform and timing of the electrical signal for explaining the driving method of the microcapsule-type electrophoresis display device, or alternatively, for a toner display device, a twist ball type display device, or an electrochromic display device. In this example, a bidirectional MIM element having a turn-on voltage of about 50V is preferably used.

A voltage of about −50V is applied to the n-th first electrode of total k pieces of the first electrode. At the same time, a voltage of about 20V is selectively applied to the second electrodes that are included in the pixels for performing white display simultaneously. The time for applying the voltage is about 500 msec, for instance.

By applying the voltages to the first and second electrodes, the MIM element corresponding to the pixel electrode 14 at the cross point of the n-th first electrode and each of the second electrodes is turned on. As a result, the desired voltage is applied to the electrophoresis layer between the picture electrode 14 and the corresponding second electrode.

In the case where blue display is conducted, a voltage of about 50V is applied to the first electrode and a voltage of about −20V is selectively applied to the second electrodes that are included in the pixel for performing blue display simultaneously. The time for applying the voltage is about 500 msec, for instance.

The same operation as that described above is performed as to the (n+1)-th first electrode for about 500*2 msec. As a result, the desired voltage is applied to the electrophoresis layer between the picture electrode 14 to which the first electrode is connected and the corresponding second electrode.

One image (one frame image) is formed by repeating these operations by k times.

For example, the time that is necessary in order to form one frame image is 500*2 k (msec).

A driving method similar to that for the electrophoresis display device can be applied to a toner display device. However, the time period for applying the voltage to the second electrode may be about 1 msec.

The toner display device conducts black-white display unlike the electrophoresis display device that conducts blue-white display.

Regarding a twist ball type display device, a similar driving method for the electrophoresis display device can be applied. However, the voltage applied to the first electrode may be about ±250V, and the voltage applied to the second electrode may be about ±100V. The time for applying the voltage to the second voltage may be about 500 msec, for instance.

The twist ball type display device conducts blue-white display unlike the electrophoresis display device that conducts black-white display.

A similar driving method for the electrophoresis display device can be applied to an electrochromic display device. However, the voltage applied to the first electrode may be about ±15V, and the voltage applied to the second electrode may be about ±5V. The time for applying the voltage to the second voltage may be about 500 msec, for instance.

The electrochromic display device conducts blue-white display.

As described above, a thyristor or an MIM element can be used as the bidirectional two-terminal element of the display device according to various preferred embodiments of the present invention. However, it is preferable to use a thyristor to obtain a better display quality.

FIG. 20A is a graph schematically showing a voltage-electric current characteristic of a thyristor, and FIG. 20B is a graph schematically showing a voltage-electric current characteristic of an MIM element.

As shown in FIG. 20A, a thyristor has a characteristic such that once a voltage over the threshold voltage is applied thereto, it enters an ON-state (low impedance state) and functions as a normally biased diode. In the on state, the voltage-electric current characteristic does not depend on the threshold voltage at all. Due to this characteristic of a thyristor, it is called as a bistable element. Therefore, even if the threshold voltages of the thyristor varies due to production process deviate, for example, the variation does not affect the display quality of the display device.

On the other hand, as can be understood from the voltage-electric current characteristic of an MIM element shown in FIG. 20B, the current in its ON-state varies depending on the threshold voltage. Therefore, if threshold voltages of the MIM element vary due to production process deviation, the variation does affect the display quality of the display device.

According to preferred embodiments of the present invention, it is possible to provide an active matrix type display device, and a method of manufacturing the same, which can be manufactured by an easier method than before and has high-quality display. In particular, it is possible, according to preferred embodiments of the present invention, to prevent the degradation of the display quality caused by a parasitic capacitance between the first electrode and picture electrode, and so it has remarkable effects especially on the high-resolution display device.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A display device comprising:
a plurality of first electrodes;
at least one bidirectional two-terminal element;
a plurality of picture electrodes electrically connected to at least one of said plurality of first electrodes via said at least one bidirectional two-terminal element, respectively;
a plurality of second electrodes; and
a display medium layer provided between said plurality of picture electrodes and said plurality of second electrodes;
wherein each of said plurality of first electrodes has an electrode layer having an opening formed at least in a portion of an area overlapping said plurality of picture electrodes.

2. The display device according to claim 1, wherein said electrode layer has a transparent conductive layer having an opening formed therein and a metallic layer formed on a side of said transparent conductive layer.

3. The display device according to claim 1, wherein a layout relationship between each of said plurality of picture electrodes and said at least one bidirectional two-terminal element is random.

4. The display device according to claim 1, wherein said at least one bidirectional two-terminal element is a thyristor having a pair of electrodes and a laminated semiconductor element disposed between said pair of electrodes.

5. The display device according to claim 1, wherein said at least one bidirectional two-terminal element is an MIM element having a pair of electrodes and an insulating layer disposed between said pair of electrodes.

6. The display device according to claim 4, wherein each of said plurality of first electrodes and said at least one bidirectional two-terminal element are electrically connected via a conductive resin layer provided between one of said pair of electrodes of said at least one bidirectional two-terminal element and said first electrode.

7. The display device according to claim 5, wherein each of said plurality of first electrodes and said at least one bidirectional two-terminal element are electrically connected via a conductive resin layer provided between one of said pair of electrodes of said at least one bidirectional two-terminal element and said first electrode.

8. The display device according to claim 6, wherein said conductive resin layer includes a conductive material and a photosensitive resin.

9. The display device according to claim 7, wherein said conductive resin layer includes a conductive material and a photosensitive resin.

10. The display device according to claim 1, wherein said opening has a width narrower than a width of said at least one bidirectional two-terminal element.

11. A method of manufacturing a display device comprising the steps of:
  (a) forming on a principal surface of a substrate a plurality of first electrodes having an electrode layer with an opening formed therein;
  (b) preparing a plurality of bidirectional two-terminal elements, each of the plurality of bidirectional two-terminal elements having a pair of mutually opposed electrodes;
  (c) placing said plurality of bidirectional two-terminal elements on said plurality of first electrodes so that each of the plurality of bidirectional two-terminal elements is electrically connected to at least one of said plurality of first electrodes via one of said pair of electrodes;
  (d) forming a plurality of picture electrodes electrically connected to at least one of said plurality of first electrodes via at least one of said plurality of bidirectional two-terminal elements, respectively; and
  (e) providing a plurality of second electrodes and a display medium layer to be mutually opposed between said plurality of picture electrodes and said plurality of second electrodes via said display medium layer.

12. The method according to claim 11, wherein said step (a) comprises the steps of:
  (a-1) forming a transparent conductive layer having an opening on the principal surface of the substrate; and
  (a-2) forming a metallic layer on a side of said transparent conductive layer by using a plating method.

13. The method according to claim 11, wherein said step (c) comprises the steps of:
  (c-1) dispersing said plurality of bidirectional two-terminal elements to a predetermined density in a coating material including a conductive material and a resin material;
  (c-2) providing said coating material including said plurality of bidirectional two-terminal elements on said plurality of first electrodes of said substrate; and
  (c-3) selectively leaving said coating material existing between said plurality of first electrodes of said substrate and said plurality of bidirectional two-terminal elements.

14. The method according to claim 11, wherein said step (d) comprises the steps of:
  (d-1) providing an insulating material to cover said plurality of bidirectional two-terminal elements placed on said plurality of first electrodes;
  (d-2) selectively eliminating an insulating material on said plurality of bidirectional two-terminal elements and thereby exposing the other electrode of each of said plurality of bidirectional two-terminal elements; and
  (d-3) forming the plurality of picture electrodes, each of the plurality of picture electrodes being electrically connected to said other electrode which is exposed.

15. The method according to claim 14, wherein said insulating material includes a negative-type photosensitive resin, and said step of exposing the other electrode includes a step of irradiating light from a backside of said substrate.

16. The display device according to claim 11, wherein said at least one bidirectional two-terminal element is a thyristor having a pair of electrodes and a laminated semiconductor element disposed between said pair of electrodes.

17. An active matrix substrate comprising:
  a plurality of first electrodes;
  at least one bidirectional two-terminal element;
  a plurality of picture electrodes electrically connected to at least one of said plurality of first electrodes via said at least one bidirectional two-terminal element, respectively;
  a plurality of second electrodes; and
  a display medium layer provided between said plurality of picture electrodes and said plurality of second electrodes;
  wherein each of said plurality of first electrodes has an electrode layer having an opening formed at least in a portion of an area overlapping said plurality of picture electrodes.

18. A method of manufacturing an active matrix substrate comprising the steps of:
  (a) forming on a principal surface of a substrate a plurality of first electrodes having an electrode layer with an opening formed therein;
  (b) preparing a plurality of bidirectional two-terminal elements, each of the plurality of bidirectional two-terminal elements having a pair of mutually opposed electrodes;
  (c) placing said plurality of bidirectional two-terminal elements on said plurality of first electrodes so that each of the plurality of bidirectional two-terminal elements is electrically connected to at least one of said plurality of first electrodes via one of said pair of electrodes;
  (d) forming a plurality of picture electrodes electrically connected to at least one of said plurality of first electrodes via at least one of said plurality of bidirectional two-terminal elements, respectively; and
  (e) providing a plurality of second electrodes and a display medium layer to be mutually opposed between said plurality of picture electrodes and said plurality of second electrodes via said display medium layer.

* * * * *